(12) United States Patent
Hu

(10) Patent No.: US 8,532,152 B2
(45) Date of Patent: Sep. 10, 2013

(54) FREQUENCY TUNABLE WIRE LASERS

(75) Inventor: Qing Hu, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 439 days.

(21) Appl. No.: 12/818,337

(22) Filed: Jun. 18, 2010

(65) Prior Publication Data

US 2011/0101250 A1 May 5, 2011

Related U.S. Application Data

(60) Provisional application No. 61/257,726, filed on Nov. 3, 2009.

(51) Int. Cl.
*H01S 3/10* (2006.01)
(52) U.S. Cl.
USPC ............................................. 372/20
(58) Field of Classification Search
USPC .................... 372/20, 92, 98–99, 102
See application file for complete search history.

(56) References Cited

U.S. PATENT DOCUMENTS

| 5,418,802 | A | 5/1995 | Chwalek | |
|---|---|---|---|---|
| 6,021,141 | A | 2/2000 | Nam et al. | |
| 7,548,566 | B2 | 6/2009 | Hu et al. | |
| 2003/0231692 | A1 | 12/2003 | Belikov et al. | |
| 2005/0207466 | A1* | 9/2005 | Glebov et al. | 372/92 |
| 2009/0074015 | A1* | 3/2009 | Stiens et al. | 372/19 |
| 2010/0002739 | A1 | 1/2010 | Hu et al. | |

FOREIGN PATENT DOCUMENTS

EP 0559192 A2 9/1993

OTHER PUBLICATIONS

International Preliminary Report on Patentability dated May 18, 2012 for Application No. PCT/US2010/055224. (7 pages).
International Search Report and Written Opinion for PCT/US2010/055224 dated Aug. 17, 2011.
Williams, et al., "Distributed-feedback terahertz quantum-cascade lasers with laterally corrugated metal waveguides," vol. 30, No. 21, Optics Letters 2005.
Qin, et al, "Tuning a terahertz wire laser," Nature Photonics, Nov. 2009.
Xu, t al., "Tunable terahertz quantum cascade lasers with an external cavity" Applied Physics Letters 91 (2007).
Williams, et al., "Operation of terahertz quantum-cascade lasers at 164K in pulsed mode and at 117 K in continuous-wave mode" vol. 13, No. 9, Optics Express (2005).
Hugi, et al., "External cavity quantum cascade laser tunable from 7.6 to 11.4" Applied Physics Letters 95 (2009).
Mahler, et al., "Single-mode operation of terahertz quantum cascade lasers with distributed feedback resonators," vol. 84, No. 26 (Jun. 2004).
Demichel, et al., "Surface plasmon photonic strutures in terahertz quantum cascade lasers," vol. 14, No. 12, Optics Express (Jun. 2006).
Qin, et al., "MEMS-based tunable terahertz wire-laser over 330 GHz", vol. 36, No. 5, Optics Letters (Mar. 2011).
Qin, et al., "MEMS-plunger platform for tunable terahertz wire laser at 5K," J. Micromech. Microeng. 21 (2011).
Gmachi, et al., "Ultra-broadband semiconductor laser," Nature vol. 415 (Feb. 2002).

* cited by examiner

*Primary Examiner* — Jessica Stultz
*Assistant Examiner* — Brian Riely
(74) *Attorney, Agent, or Firm* — Pepper Hamilton, LLP; Thomas Engellenner; Reza Mollaaghababa

(57) ABSTRACT

The present invention provides frequency tunable solid-state radiation-generating devices, such as lasers and amplifiers, whose active medium has a size in at least one transverse dimension (e.g., its width) that is much smaller than the wavelength of radiation generated and/or amplified within the active medium. In such devices, a fraction of radiation travels as an evanescent propagating mode outside the active medium. It has been discovered that in such devices the radiation frequency can be tuned by the interaction of a tuning mechanism with the propagating evanescent mode.

40 Claims, 21 Drawing Sheets

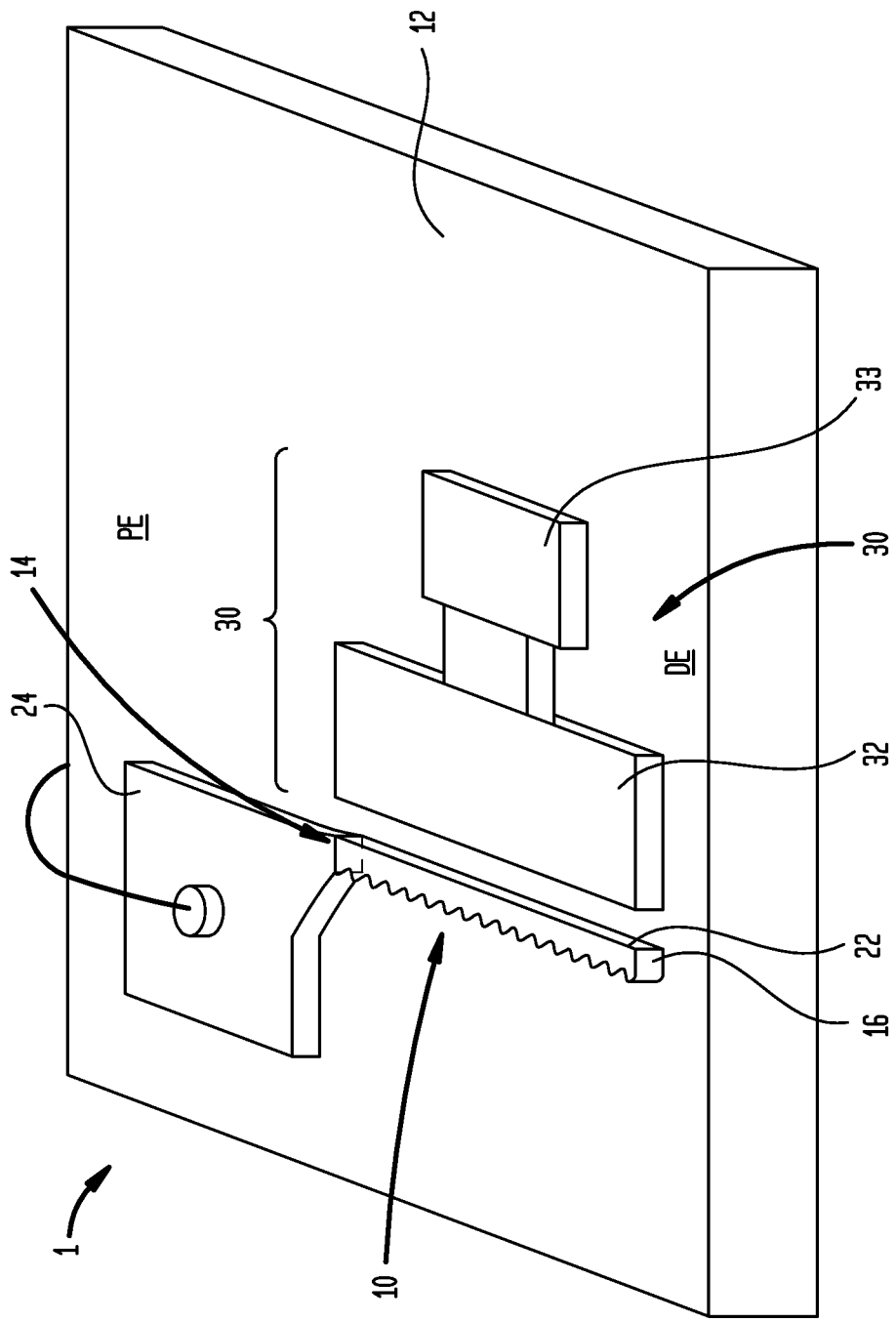

FIG. 8A
DEFORMATION: DISPLACEMENTS (Pa)　　MAX: 20.594
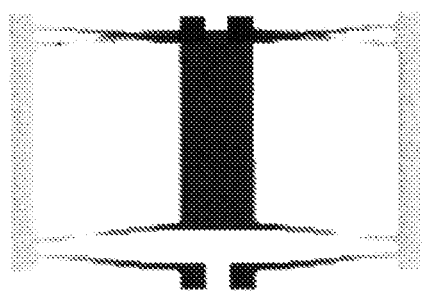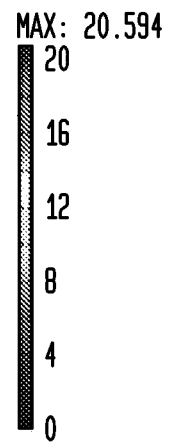
FIG. 8B
SUBDOMAIN: VON MISES STRESS [MPa]　　MAX: 249.159
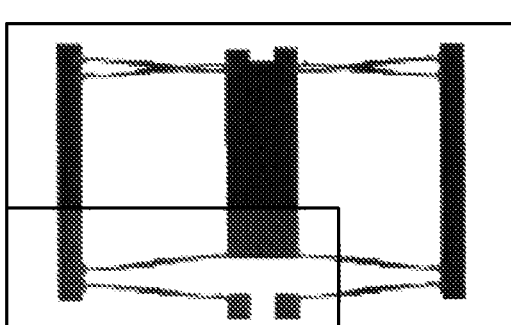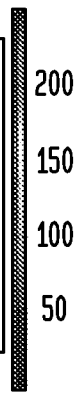
FIG. 8C
SUBDOMAIN: VON MISES STRESS [MPa]　　MAX: 249.159
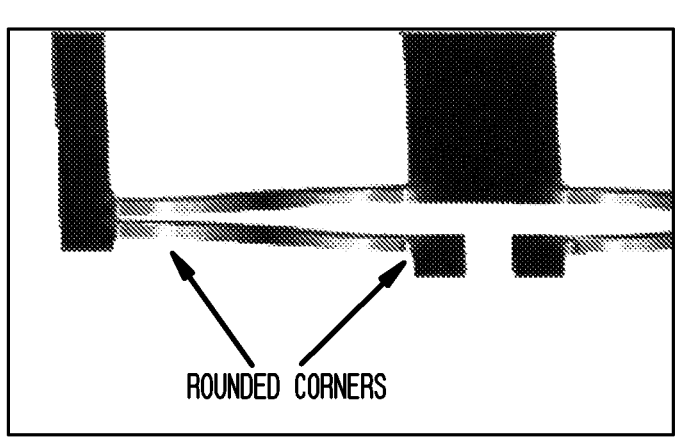
ROUNDED CORNERS

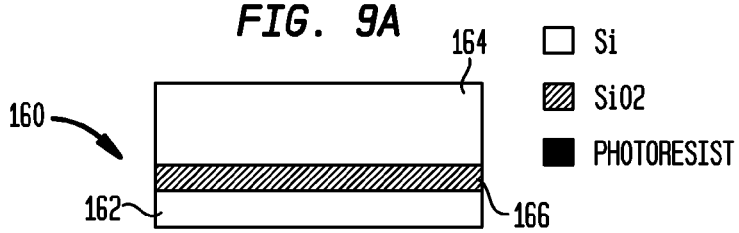
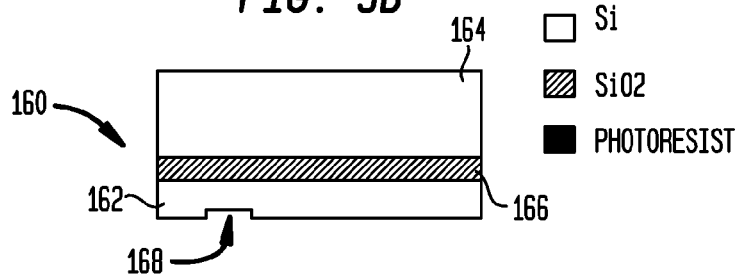
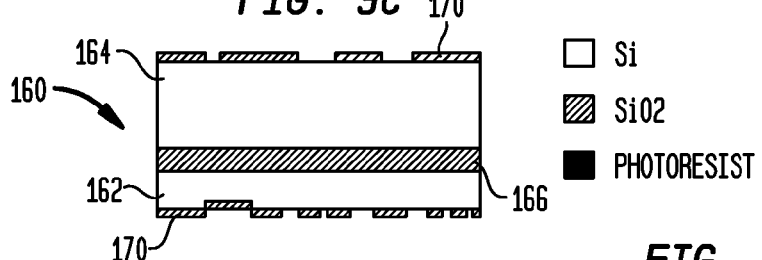
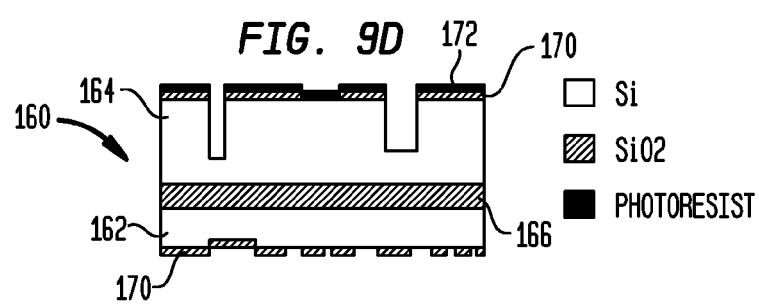
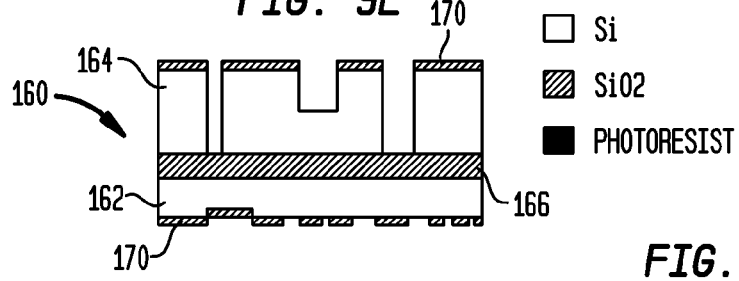
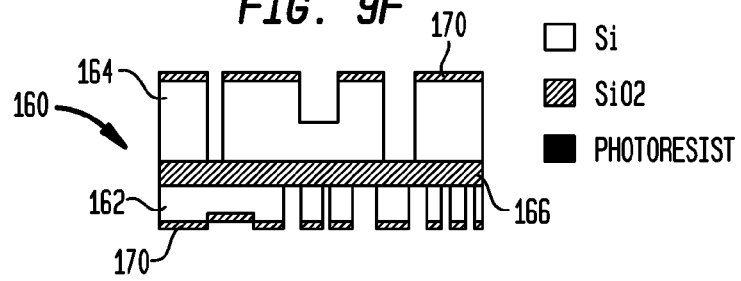

a    67 GHz CONTINUOUS BLUESHIFT TUNING

87 GHz CONTINUOUS REDSHIFT TUNING

FREQUENCY TUNABLE WIRE LASERS

CROSS-REFERENCE TO RELATED APPLICATIONS

The present application claims priority to U.S. Provisional Application No. 61/257,726 filed on Nov. 3, 2009 and entitled "Tunable Wire Lasers," which is hereby incorporated by reference.

STATEMENT REGARDING FEDERALLY SPONSORED RESEARCH

This invention was made with government support under Grant NNX07A199G by NASA, Grant FA9550-06-1-0462 by AFOSR, and Grant ECCS0853470 by NSF. The government has certain rights in the invention.

BACKGROUND

The present invention relates generally to frequency tunable semiconductor radiation-generating devices, such as lasers (e.g., tunable wire lasers), as well as methods for tuning frequency of such devices.

Frequency tunable lasers are employed in a variety of applications, such as spectroscopy, imaging (e.g., coherent optical tomography (OCT)), and sensing applications among others. Conventional techniques for tuning the frequency of a semiconductor laser can include, e.g., changing the refractive index of the lasing medium (e.g., via a change in its temperature) and/or changing the longitudinal mode profile of the laser radiation (e.g., via a change in the cavity length in external-cavity lasers).

The conventional laser frequency tuning techniques, however, suffer from a number of shortcomings. For example, the conventional frequency tuning methods are difficult to implement in lasers in which the wavelength of the laser radiation in the active medium is much larger than a cross-sectional dimension of the active medium. For example, the radiation wavelength of a laser operating in the terahertz region of the electromagnetic spectrum (e.g., a radiation wavelength in a range of about 30 microns to about 300 microns) can be significantly larger than a cross-sectional dimension of the active medium. The difficulties in tuning the frequency of terahertz lasers are evident in that continuous frequency tuning over a broad frequency range (e.g., greater than 100 GHz) using an external-cavity grating has yet to be achieved, and electrical tuning, e.g., by changing the refractive index due to temperature or due to a cavity-pulling effect, produces a relatively small fractional tuning (<1%).

Hence, there is a need for enhanced methods for tuning the frequency of semiconductor radiation-generating devices (e.g., terahertz lasers). There is also a need for enhanced semiconductor frequency tunable radiation-generating devices operating at wavelengths that are significantly greater than the cross-sectional dimension(s) of their active medium.

SUMMARY

In one aspect, the present invention provides a frequency tunable wire laser that includes a lasing medium for generating laser radiation having a transverse mode profile in the lasing medium and a frequency. The tunable wire laser can also include a frequency tuning mechanism external to the lasing medium for changing the transverse mode profile of the laser radiation in the lasing medium so as to adjust the laser frequency. In some embodiments, a transverse cross sectional dimension of the lasing medium can be at least about 5 times, and in some cases at least about 10 times, less than a wavelength of the laser radiation in that medium.

In the above wire laser, a fraction of the laser radiation field of the transverse mode profile can extend outside the lasing medium and propagate along the lasing medium as a propagating evanescent wave. It has been discovered that the frequency of the laser radiation can be tuned by adjusting the amount of the laser energy that is contained in this propagating evanescent wave. For example, the tuning mechanism can interact with the propagating evanescent radiation so as to modulate the transverse mode profile (e.g., increase or decrease the degree of confinement of the traverse mode profile within the lasing medium), thereby adjusting the laser frequency.

In some embodiments, the frequency tuning mechanism can include a tuning element movable relative to the lasing medium, which can be configured to tune the laser frequency without causing a substantial change, or in some cases any change, in a longitudinal mode profile of the laser radiation. An actuator can be coupled to the tuning element for moving it so as to change the laser frequency as a function of distance of the tuning element relative to the lasing medium. The tuning element can be formed of any suitable material, for example a metal, such as gold, silver, copper and aluminum or a dielectric, e.g., a semiconductor such as silicon, germanium, and compound semiconductors; or plastics.

In a related aspect, the frequency tuning mechanism can be configured to allow tuning the laser frequency about a central frequency over a range of about 30% of the central frequency. In many embodiments, the frequency tuning mechanism can be configured to provide continuous tuning of the laser frequency over a selected frequency range.

The teachings of the invention are applicable to wire lasers operating in any frequency range. By way of example, the laser can operate in a frequency range of about 1 THz to about 10 THz.

In some embodiments, the wire laser can include a double metal waveguide coupled to the lasing medium so as to provide mode confinement of the laser radiation. For example, the transverse mode profile that is employed for tuning the laser frequency can extend along the width of the lasing medium of the laser, and the double metal waveguide can provide mode confinement of the laser direction along an orthogonal transverse direction (e.g., along the height of the lasing medium).

In some embodiments, the lasing medium can include a distributed feedback (DFB) grating that is configured to facilitate single mode lasing. While the DFB can have many configurations, the DFB grating can include, for example, an asymmetric distributed feedback corrugation structure such that the lasing medium includes a corrugated side and a substantially flat side. In such embodiments, the frequency tuning mechanism can include a tuning element that is movable relative to the flat side. By way of example, the tuning element can be configured to move along a direction substantially orthogonal to the flat side of the lasing medium so as to vary its distance relative to the lasing medium for tuning the laser frequency. In some embodiments, the tuning element can be in the form of a block having a flat side that is substantially parallel to the flat side of the lasing medium and the laser frequency changes as a function of a distance between the flat side of the tuning block and the flat side of the lasing medium. In some embodiments, the flat side of the tuning block and that of the lasing medium are parallel relative to each other with an accuracy of better than about 1 degree. By way of example, in some embodiments, the tuning of the laser frequency can be achieved by varying the distance between the flat surface of the tuning block and that of the lasing medium within a range of about 0.5 microns and 20 microns for tunable laser operating at THz frequencies.

In some embodiments, e.g., those in which the tuning element is formed of a metal, the laser frequency increases as the distance between the tuning element (e.g., a metalized surface of the tuning element) and the lasing medium (e.g., a flat side surface of the lasing medium) decreases. In other embodiments, e.g., those in which the tuning element is formed of a dielectric material, the laser frequency decreases as the distance between the tuning element and the lasing medium decreases.

In some embodiments, the tuning element can be implemented as a microelectromechanical systems (MEMS) device, which can be coupled to a device wafer on which a wire laser is disposed. For example, such a MEMS device can include two spring stages that are mechanically coupled to one another, where one stage can be pushed via an external actuator toward the second stage to cause movement thereof. The movement of the second stage can in turn change, e.g., the distance between a side surface thereof (e.g., a metal coated side surface) relative to the lasing medium of the wire laser so as to tune the frequency of the laser radiation in a manner discussed above. In some cases, the second stage is configured to be stiffer than the first stage, for example, the springs associated with the second stage can be several times (e.g., 2 or more times) thicker than those of the first stage.

A variety of actuators can be employed for moving the tuning element relative to the lasing medium. For example, the actuator can be a mechanical, an electronic, or an electromechanical device. Some examples include, without limitation, a differential micrometer and a piezoelectric actuator. In some cases in which the tuning element is implemented as a MEMS device, the actuator can be integrated in the MEMS device. For example, it can be implemented as a comb-drive mechanism.

In some embodiments, the wire laser can be optically coupled to an amplifier, e.g., a semiconductor optical amplifier (SOA), such that the amplifier receives the laser radiation emitted by the laser through an input facet (port) thereof. The amplifier amplifies the received radiation, which then leaves the amplifier through an output facet (port) thereof. In some embodiments, the amplifier has a tapered configuration and its output facet can be anti-reflection (AR) coated and tilted relative to an output facet of the lasing medium to prevent direct reflection of the radiation back to the lasing medium. Further, in some embodiments a radiation-absorbing layer can be placed on a top surface of the amplifier to dampen any residual reflection from its output facet. Moreover, in some embodiments a lens, such as a silicon hemispherical lens, can be coupled to the output facet of the amplifier to increase the radiation output power and/or to reduce the divergence of the output beam.

In other aspects, a tunable laser is provided that includes a semiconductor lasing medium for generating laser radiation having a mode characterized by a transverse distribution of the laser radiation field such that a fraction of the radiation field extends outside the lasing medium as the laser radiation propagates along the lasing medium. The tunable laser can further include a tuning element external to the lasing medium. The tuning element can be movable relative to the lasing medium for interacting with the radiation field extending outside the lasing medium so as to change the frequency of the laser radiation.

In some embodiments, the lasing medium can have at least one transverse cross-sectional dimension that is at least about 5 times, or at least about 10 times, less than a wavelength of the laser radiation in the lasing medium. In some implementations, the tunable element can be configured to reduce the fraction of the laser radiation field extending outside the laser medium as its distance decreases relative to the lasing medium so as to cause an increase in the laser radiation frequency. In other implementations, the tuning element can be configured to enhance the fraction of the laser radiation field extending outside the laser medium as its distance decreases relative to the lasing medium so as to cause a decrease in the laser radiation frequency. An actuator can be coupled to the movable tuning element for moving it relative to the lasing medium.

In general, the transverse distribution of the laser radiation can be characterized by a transverse wave vector, and the longitudinal distribution of the laser radiation within the lasing medium can be characterized by a longitudinal wave vector. In some cases, the laser frequency and the transverse and longitudinal wave vectors are related by the following relation:

$$k_z^2 + k_\perp^2 = \omega^2 \mu \in$$

in which $k_z$ denotes the longitudinal wave vector, $k_\perp$ denotes the transverse wave vector, $\mu$ denotes magnetic permeability of the lasing medium, $\in$ denotes dielectric constant of the lasing medium, and $\omega$ denotes angular frequency of the laser radiation, which in turn is defined as:

$$\omega = 2\pi f,$$

in which f denotes the laser frequency. The tuning element can change the transverse wave vector $k_\perp$ so as to change the frequency of the laser radiation. In many embodiments, the change of the transverse wave vector can be achieved without changing the other parameters, such as the longitudinal wave vector ($k_z$) or the dielectric constant ($\in$).

In a related aspect, a method for tuning a wire laser is provided that includes adjusting a transverse mode of laser radiation generated by a lasing medium of the laser so as to change the frequency of the laser radiation.

In a related aspect, the step of adjusting the transverse mode can be performed without causing a substantial change, or in many cases any change, in the longitudinal mode of the laser radiation. By way of example, the step of adjusting the transverse mode can include changing a transverse distance of an external tuning element relative to the lasing medium. The external tuning element can be formed of any suitable material, such as a metal and/or a semiconductor. In some embodiments, the wire laser can be configured to generate laser radiation with a frequency in a range of about 1 THz to about 10 THz.

In other aspects, a tunable terahertz laser is provided that includes a semiconductor lasing medium for generating laser radiation with a frequency in a range of about 1 THz to about 10 THz. The lasing medium can have a width that is at least about 5 times, and in some cases at least about 10 times, less than a wavelength of the laser radiation. Further, the laser can include a frequency tuning mechanism having a tuning element movable relative to the lasing medium for changing a transverse mode profile of the laser radiation so as to tune the laser frequency.

In another aspect, a semiconductor wire laser is provided that includes a lasing medium for generating laser radiation propagating along the lasing medium and characterized by a frequency. The laser radiation can have a profile characterized by a longitudinal wave vector and a transverse wave vector. Furthermore, a frequency tuning mechanism is also provided for tuning the laser frequency by adjusting the transverse wave vector without causing a substantial, or in many cases any, change in the longitudinal wave vector.

In other aspects, the present invention provides incoherent radiation sources, such as amplified spontaneous emission (ASE) sources, that include an active medium having at least one transverse dimension with a size that is at least about 5 times, or at least about 10 times, less than the wavelength of the radiation generated by the device in the active medium such that a portion of the radiation propagates along the active medium as a propagating evanescent wave. A frequency tuning mechanism external to the active medium can interact with the propagating evanescent wave in order to adjust a transverse mode profile of the radiation in the active medium, thereby changing the frequency of the radiation. For example, the frequency tuning mechanism can include a plunger movable relative to a side surface of the active medium so as to modulate the confinement of the transverse mode profile within the active medium as a function of a change in its distance relative to the active medium. By way of example, the plunger can comprise a metal portion that can enhance the confinement of the transverse mode profile within the active medium as its distance relative to the active medium decreases. By way of another example, the plunger can include a dielectric portion that can lower the confinement of the transverse mode profile within the active medium (e.g., by causing some of the radiation to "leak" into the plunger) as its distance relative to the active medium decreases.

In another aspect, a frequency stabilized wire laser is disclosed that includes an active medium for generating laser radiation at a single lasing mode. The active medium includes at least one transverse dimension that is at least about 5 times, and in some cases at least about 10 times, smaller than the wavelength of the radiation within the active medium. Hence, a fraction of the laser radiation propagates as an evanescent propagating wave outside the active medium. The wire laser further includes a spectrometer that receives a portion of the radiation generated in the active medium and measures the frequency of the radiation. A processor in communication with the spectrometer compares the measured frequency with a predefined value. If the processor detects a deviation between the measured frequency and the predefined value that exceeds a predefined threshold, it sends a signal to a frequency stabilization mechanism for adjusting the frequency towards the predefined value. The frequency stabilization mechanism includes a tuning element external to the active medium that is movable relative to the active medium for interacting with a propagating evanescent wave so as to adjust a transverse laser radiation profile, thereby adjusting the frequency towards the predefined value.

Further understanding of the invention can be obtained by reference to the following detailed description in conjunction with the associated drawings, which are described briefly below.

BRIEF DESCRIPTION OF THE DRAWINGS

FIG. 1B shows another schematic view of the tunable wire laser of FIG. 1A, illustrating a bonding pad coupled to the active medium of the wire laser;

FIG. 8A schematically illustrates mechanical simulation results for a double-fold beam implementation of the second stage of the MEMS-based tuning mechanism of FIG. 7A;

FIG. 8B schematically illustrates simulation results of von Mises stress in the MEMS-based tuning mechanism of FIG. 7A;

FIG. 8C schematically illustrates an enlarged view of FIG. 8B showing the stress concentration near the corners of the tuning structure;

FIGS. 9A-9F schematically depict various steps in an exemplary process for fabricating the MEMS-based tuning mechanism of FIG. 7A;

DETAILED DESCRIPTION

The present invention is generally directed to frequency tunable solid-state radiation-generating devices, such as lasers, whose active medium has a size in at least one transverse dimension (e.g., its width) that is much smaller than the wavelength of radiation generated within the active medium. For example, the size in the transverse dimension can be at least about 5 times, or in some cases at least about 10 times, less than the radiation wavelength in the active medium. In such devices, a fraction of radiation travels as an evanescent propagating wave outside the active medium. It has been discovered that in such devices the radiation frequency can be tuned by the interaction of a tuning mechanism with the propagating evanescent wave so as to change the transverse mode profile of the radiation in the active medium. For example, radiation frequency can be changed by adjusting the amount of radiation energy carried by the propagating evanescent wave. The term "wire laser" as used herein refers to a semiconductor laser having a active medium (herein also referred to as the gain medium or the lasing medium) whose size in at least one transverse dimension, e.g., along a direction orthogonal to the direction of propagating laser radiation, is at least about 5 times, and in some cases at least about 10 times, less than the wavelength of the laser radiation in the active medium.

Figure 1A:
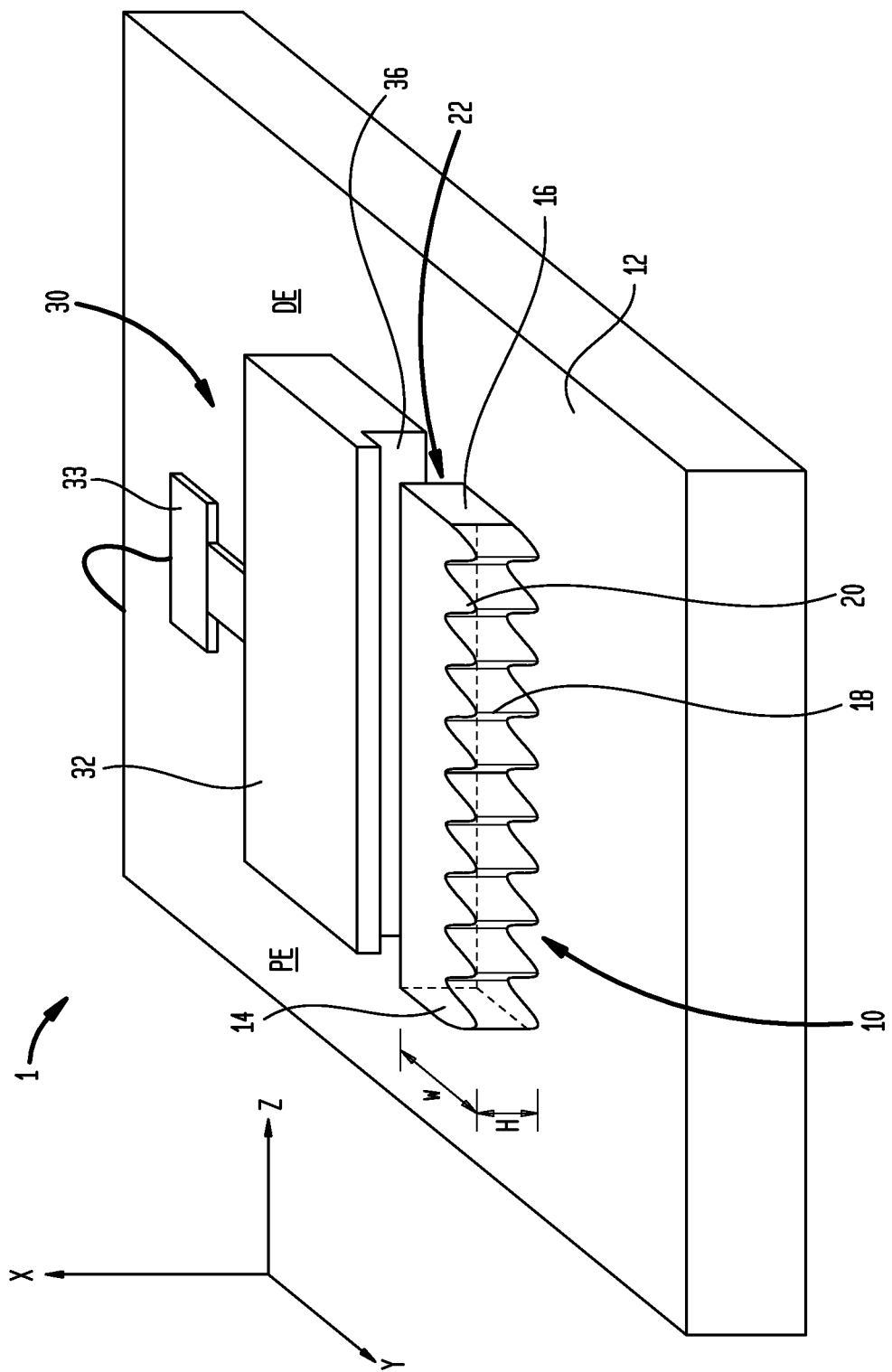
FIG. 1A schematically depicts a frequency tunable wire laser according to an embodiment of the invention; illustrating an active medium as well as a frequency tuning mechanism.
Figure 1C:
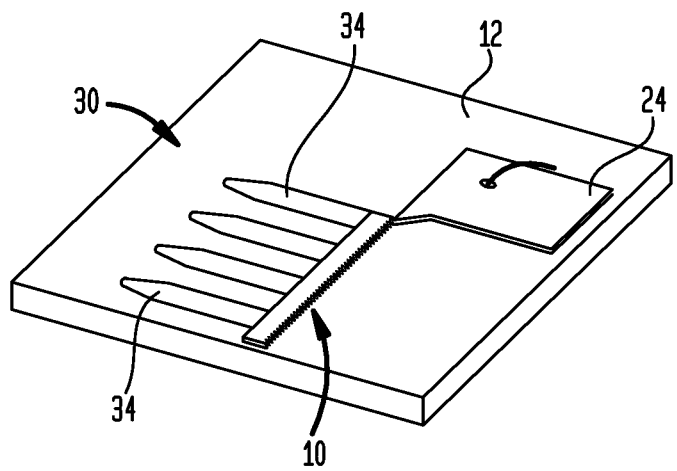
FIG. 1C shows another schematic view of the tunable wire laser of FIG. 1A, illustrating guide rails for moving a tuning element of the tuning mechanism.
Figure 1D:
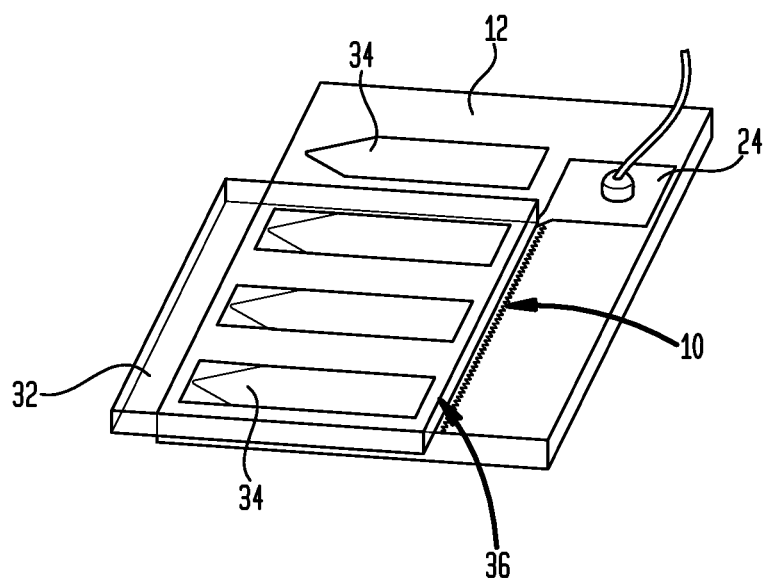
FIG. 1D is another schematic view of the guide rails illustrated in FIG. 1C.

FIGS. 1A and 1B schematically depict a frequency tunable semiconductor wire laser 1 according to an embodiment of the invention, which includes a lasing medium 10 (herein also referred to as an active medium or a gain medium) extending from a proximal end (PE) to a distal end (DE) along an axial (longitudinal) direction (herein also referred to as the z-direction). In this exemplary embodiment, the lasing medium 10 is in the form of a ridge waveguide formed on a underlying substrate 12. In this embodiment, the ridge waveguide has a rectangular transverse cross-section characterized by a width (w) along one transverse direction (herein also referred to as the y-direction) and a height (h) along another transverse direction (herein also referred to as the x-direction). The lasing medium 10 is configured to generate laser radiation at a desired frequency. For example, in some cases, the lasing medium 10 is configured to generate radiation in the terahertz or the infrared portion of the electromagnetic spectrum— though other frequency ranges (e.g., the visible portion of the electromagnetic spectrum) can also be utilized.

The lasing medium 10 includes a back facet 14 and a front facet 16 that are cleaved and configured, e.g., via partial or complete metallization, in a manner known in the art to provide a Fabry-Pérot cavity for defining longitudinal modes of the laser radiation. The term "longitudinal mode" as used herein refers to a distribution (variation) of the laser radiation field (electric and/or magnetic field) along the propagation direction of the laser radiation (in this case, along the z-direction). In the following discussion, the wavevector of the laser radiation along the longitudinal direction is referred to as ($k_z$).

In this exemplary embodiment, the lasing medium 10 includes a first-order distributed feedback (DFB) grating to ensure single mode operation of the laser. More specifically, the lasing medium includes an asymmetric DFB corrugation structure 20, where the corrugation is formed on a side surface 18 of the lasing medium 10. The opposed side surface 22 is flat. In this implementation, the corrugation is in the form of a sinusoidal modulation to ensure a smooth side wall 18. In many embodiments, in the longitudinal direction under resonance condition the following relation holds:

$$k_z = \frac{\pi}{\Lambda},$$

where $\Lambda$ is the grating period, resulting in two standing-wave solutions each at a different frequency. In other words, the DFB grating results in a bandgap separating a lower band-edge mode from an upper band-edge mode. The position of the front facet 16 relative to the DFB grating can be designed to impart a lower radiation loss to one of these laser modes, thereby selecting that laser mode for a single-mode operation. By way of example, this can be achieved by placing the front facet at the widest section of the corrugated waveguide.

In this exemplary embodiment, in the upper band-edge mode the maximum laser radiation intensity is localized at the narrow part of the grating. This in turn results in a larger value for the transverse wave vector of the laser radiation, which can enhance the frequency tuning range, as discussed in more detail below.

In some embodiments, the corrugation of the DFB grating can formed, e.g., by employing contact lithography and dry etching.

With reference to FIG. 1B, a bonding pad 24 is electrically coupled to the rear facet 14 of the lasing medium, which can be metalized, to allow application of a voltage (e.g., a dc voltage) to, or the injection of a current into, the lasing medium.

The width (w) of the lasing medium 10 is significantly smaller than the wavelength ($\lambda$) of the laser radiation within the lasing medium 10. That is, $$\frac{w}{\lambda} \ll 1.$$

For example, the width (w) is at least about 5 times, or at least about 10 times, or at least about 20 times, smaller than the wavelength ($\lambda$). Consequently, a fraction of a laser radiation mode travels outside the solid core of the lasing medium 10 as a propagating evanescent mode. More specifically, a portion of a transverse mode of the laser radiation can extend outside the lasing medium as a propagating evanescent mode. In some embodiments, as much as about 50% of the laser radiation energy can propagate as a propagating evanescent mode. The term "transverse mode" as used herein refers to a distribution (variation) of the laser radiation field (electric and/or magnetic field) along a direction different from the propagation direction of the laser radiation (e.g., along a direction orthogonal to the propagation direction, such as the y-direction in this embodiment).

Figure 2A:
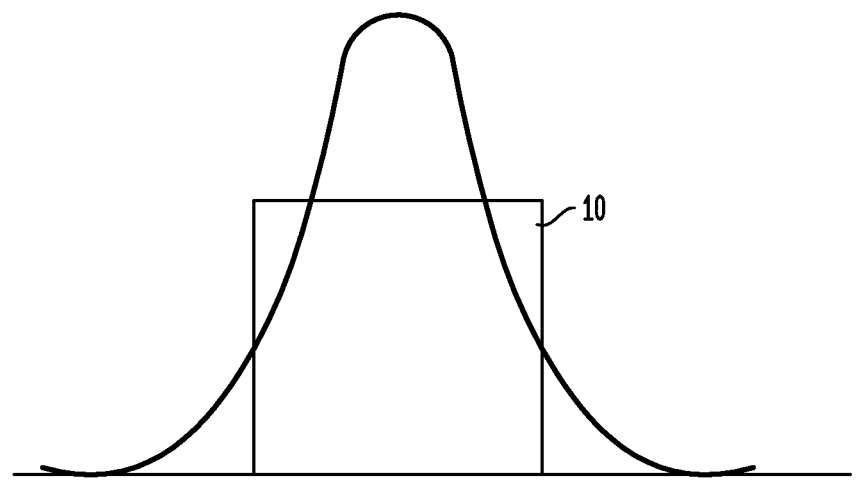
FIG. 2A schematically shows a transverse profile of the electric field associated with a laser radiation mode of the wire laser of FIG. 1A in absence of the tuning mechanism.

By way of example, FIG. 2A schematically shows the profile of the electric field associated with a transverse laser radiation mode of the wire laser in a plane perpendicular to the laser propagation direction (e.g., along the x-direction in this embodiment) in absence of a frequency tuning mechanism 30. A portion of the electric field, and hence a portion of the laser radiation energy, penetrates outside the lasing medium 10 and travels along the longitudinal direction as an evanescent propagating mode. As discussed in more detail below, the tuning mechanism 30 is configured to interact with this evanescent propagating mode to tune the frequency of the laser radiation.

More specifically, with reference to FIGS. 1A, 1B, 1C, and 1D, the tuning mechanism 30 can include a frequency tuning element formed, e.g., of a metal or a semiconductor material, that is movable relative to the lasing medium 10. In this exemplary embodiment, the tuning element is configured to move along a plurality of guiding rails 34 formed in the underlying substrate 12 in a direction substantially orthogonal to the flat side face 22 of the lasing medium 10. In this exemplary implementation, the tuning element is in the form of a plunger 32 that is coupled to an actuator 33, e.g., a piezoelectric element, a differential micrometer or a combination of the two or any other suitable device, which causes it to move relative to the flat side face 14. By way of example, the actuator 33 can be configured to cause a back-and-forth movement of the plunger 32 about an equilibrium position such that the plunger 32 can be moved closer to, or farther away from, the lasing medium 10 so as to modulate the interaction of the plunger 32 with the evanescent propagating laser radiation, thereby adjusting the laser frequency as discussed in more detail below. A variety of actuators including, without limitation, mechanical, electrical or electromechanical actuators can be employed.

With continued reference to FIGS. 1A-1D, the lengths of guide rails 34 can be configured to modulate the distance between the plunger 32 and the lasing medium 10 such that the plunger 32 can effectively interact with the evanescent propagating radiation as it approaches the lasing medium 10 while preventing physical contact between the plunger 32 and the lasing medium 10. By way of example, the side wall of the plunger 32 facing the lasing medium 10 (e.g., side wall 36 in this embodiment) can be defined, e.g., by using dry etching, to include slots (not shown) matching the guide rails 34 with stoppers at the end of the guide rails 34 in proximity to the lasing medium 10 (not shown) to facilitate the movement of the plunger 32 along the rails 34 while inhibiting its physical contact with the lasing medium 10. In some embodiments, the minimum distance between the plunger 32 and the lasing medium 10, e.g., the flat side surface 14 in this embodiment, can be, e.g., in a range of about 0.5 microns to about 30 microns.

Figure 2B:
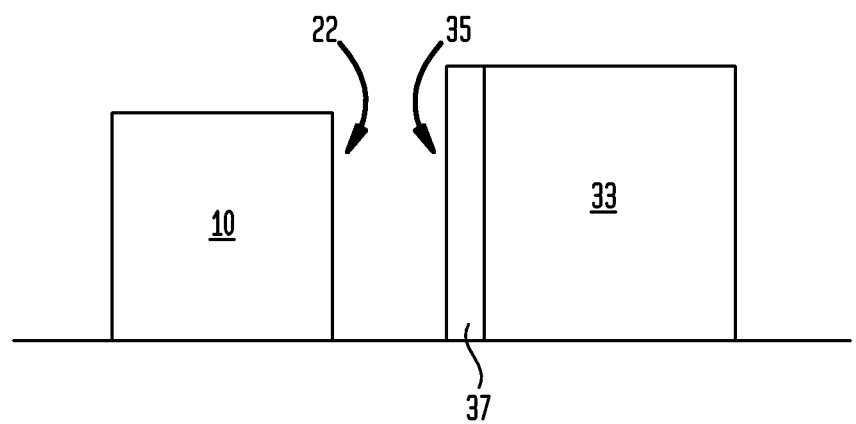
FIG. 2B schematically depicts an exemplary implementation of the wire laser of FIG. 1A in which a surface of the tuning element includes a thin layer of SiN.

The plunger 32 can be formed of a variety of materials. By way of example, in some embodiments, the plunger 32 is formed of a metal, e.g., gold, silver, copper, or aluminum, while in other embodiments, the plunger 32 is formed of a dielectric material, e.g., silicon, germanium, compound semiconductors, or plastics. With reference to FIG. 2B, in some embodiments, a face 35 of a metal plunger 33 opposed to a side face of the lasing medium, e.g., the flat side face 22, is covered with a thin insulating layer 37, e.g., a thin layer of SiN, to prevent shorting the plunger 33 with the device. By way of example, the thickness of the insulating layer 37 can be in a range of about 0.1 microns to about 0.5 microns.

Figure 3A:
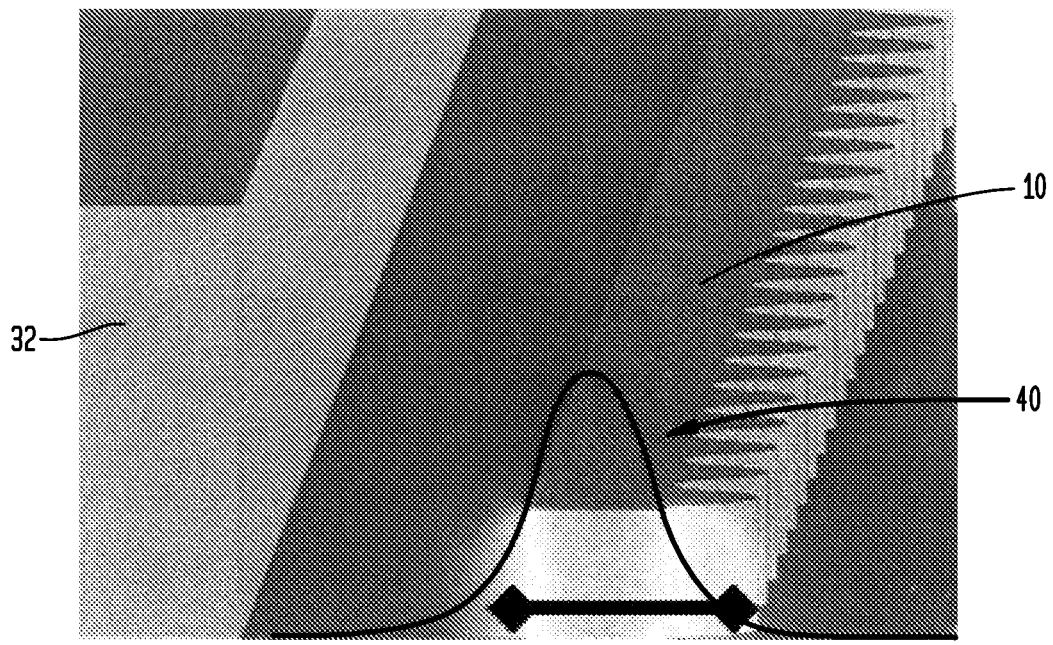
FIG. 3A schematically shows a transverse electric field profile of laser radiation within an active medium of a wire laser with a metal frequency tuning element a distance away from the active medium, illustrating that a portion of the transverse electric field extends outside the active medium.
Figure 3B:
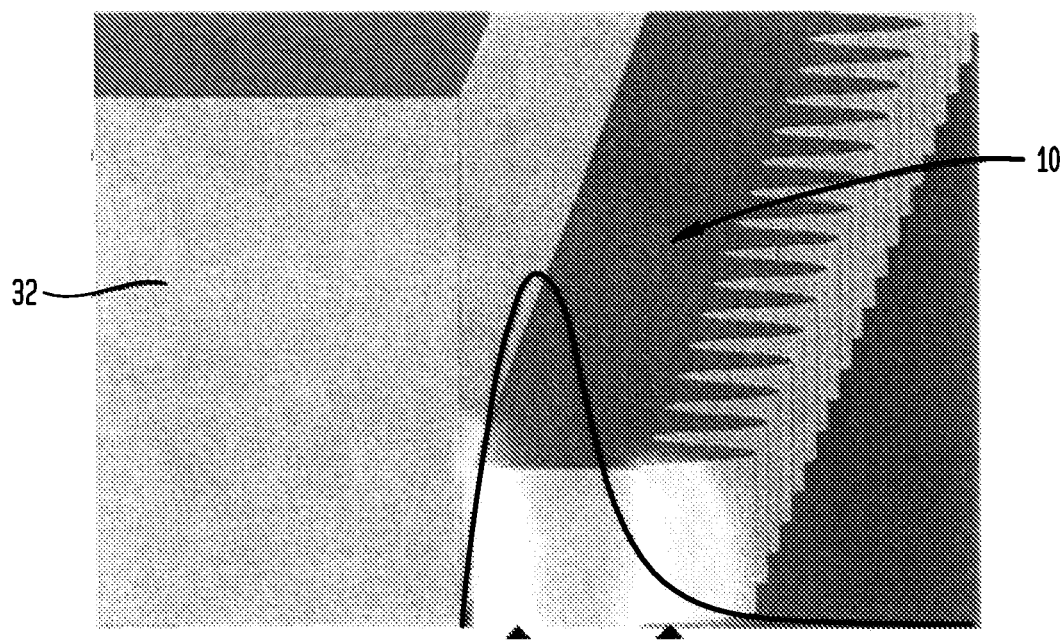
FIG. 3B schematically shows the metal tuning mechanism of FIG. 3A closer to the active medium so as to enhance the confinement of the transverse mode of the laser radiation in the active medium, thereby increasing the laser frequency.

With reference to FIGS. 3A and 3B, in the embodiments in which the plunger 32 is formed of a metal, as the plunger 32 approaches the lasing medium 10 it enhances the confinement of the transverse mode profile of the laser radiation within the lasing medium, thereby causing a blue-shift of the laser radiation (i.e., an increase in the laser frequency). Further, as the metal plunger 32 approaches the lasing medium 10, it pushes the transverse mode towards the DFB corrugation, thereby increasing its coupling with the grating as well as enhancing the bandgap of the grating. The increase in the bandgap accentuates the blueshift tuning as the plunger 32 approaches the lasing medium 10.

Figure 4A:
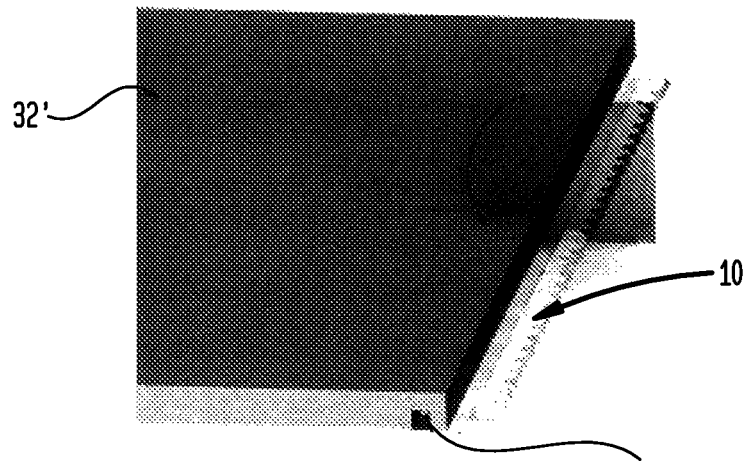
FIG. 4A schematically shows a tunable wire laser according to an embodiment of the invention having an active medium and a frequency tuning element movable laterally relative to the active medium, where the tuning element is formed of a semiconductor material.
Figure 4B:
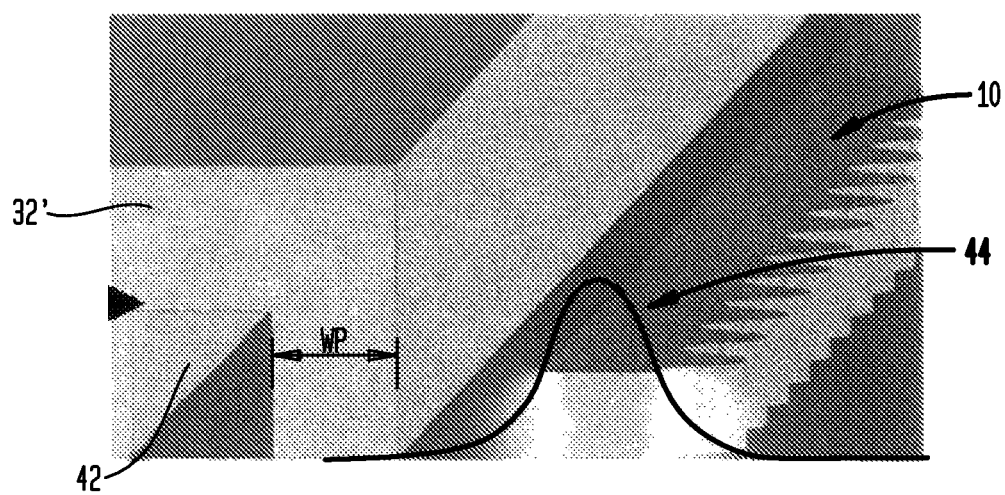
FIG. 4B schematically shows the transverse mode profile of the electric field associated with a laser radiation mode of the wire laser of FIG. 4A with the tuning element a distance from the active medium, illustrating that a fraction of the transverse electric field extends outside the active medium.
Figure 4C:
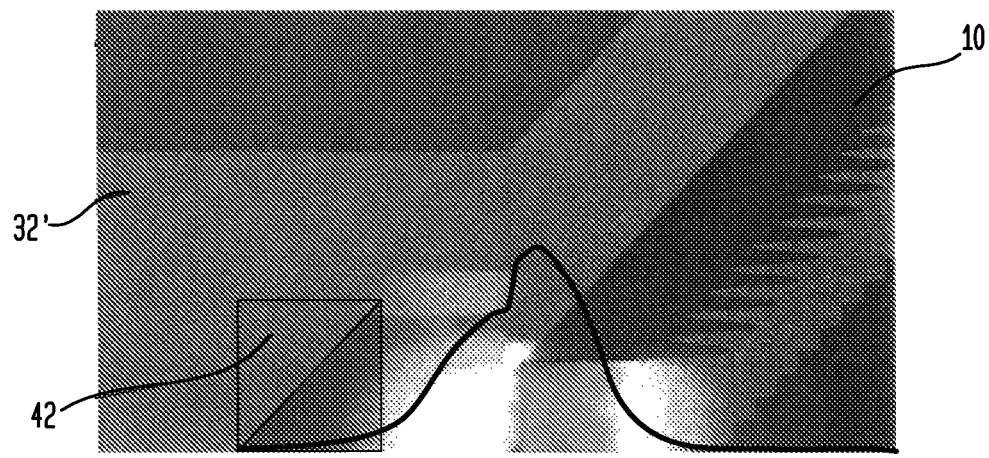
FIG. 4C schematically shows the semiconductor tuning mechanism of FIG. 4A at a position closer to the active medium such that it extracts a larger fraction of the transverse mode outside the active medium, thereby decreasing the laser radiation frequency.

With reference to FIGS. 4A, 4B and 4C, in other embodiments in which a plunger 32' is formed of a semiconductor material, such as silicon, as the plunger 32' approaches the lasing medium 10, it enhances the fraction of the laser radiation in the propagating evanescent mode. In other words, the interaction of the silicon plunger 32' with the propagating evanescent wave further increases the fraction of the laser energy propagating as an evanescent wave outside the lasing medium, thereby causing a red-shift of the laser radiation (i.e., a decrease in the laser frequency). Further, as the semiconductor plunger 32' approaches the lasing medium 10, it extracts the transverse mode away from the DFB corrugation, thereby lowering the bandgap of the grating. The lowering of the bandgap in turn enhances the redshift tuning of the laser frequency as the silicon plunger 32' approaches the lasing medium 10. In this embodiment, the silicon plunger 32' includes a hollow cavity 42, which defines a width (wp) of the plunger to be small enough so as to ensure a sufficient mode overlap with the lasing medium to achieve lasing. By way of example, in some embodiments, the width (wp) of the semiconductor plunger can be less than about 20 microns, e.g., it can be in a range of about 10 microns to about 20 microns.

In some embodiments, the tuning mechanism allows tuning the laser frequency over a range that is at least about 30% of a center frequency. In many embodiments, a side of the plunger, e.g., side surface 36 of the plunger, is aligned parallel to a side of the lasing medium relative to which it moves, e.g., the flat side 32 of the lasing medium 10, with an alignment accuracy of at least about 1 degree to maximize the frequency tuning range of the laser. Such alignment accuracy can be achieved, for example, by employing alignment posts during fabrication or implementing the plunger as two spring stages where the second spring stage is stiffer, or other suitable techniques.

The above tuning of the wire laser can be achieved without causing a substantial change, or in some cases any change, in the longitudinal mode profile of the laser radiation, e.g., via external tuning elements and/or a change in the temperature of the lasing medium. Alternatively, in some embodiments, frequency tuning by adjusting a transverse mode profile of a wire laser can be combined with other types of frequency tuning (e.g., a change in the longitudinal mode profile and/or the dielectric constant of the lasing medium).

Without being limited to any particular theory or implementation, the frequency tuning of a wire laser by changing its transverse mode profile via interaction with a propagating evanescent wave can be perhaps better understood by considering that in a uniform gain medium the transverse wavevector ($k_\perp$), the longitudinal wavevector ($k_z$) and the angular frequency ($\omega$) of the laser radiation are related by the following relation:

$$k_z^2 + k_\perp^2 = \omega^2 \mu_0 \in \qquad \text{Eq. (1)},$$

wherein, $k_z$ denotes the longitudinal wave vector, $k_\perp$ denotes the transverse wave vector, which is defined as: $k_\perp = \sqrt{k_x^2 + k_y^2}$, where $k_x$ and $k_y$ denote, respectively, wave vectors along the x and y directions in a plane perpendicular to z direction (i.e., the propagation direction of the laser radiation), $\mu$ denotes magnetic permeability of the lasing medium, $\in$ denotes dielectric constant of the lasing medium, and $\omega$ denotes angular frequency of the laser radiation, which in turn is defined as:

$\omega = 2\pi f$, where f denotes the laser frequency.

The above Equation (1) shows that a laser frequency (f) can be tuned by changing one or more of the following three parameters: $k_z$, $k_\perp$, and $\in$. In conventional tunable lasers, only $k_z$ and/or $\in$ are changed for tuning the laser. In contrast, the frequency tunable wire lasers according to the teachings of the invention rely on changing $k_\perp$ to achieve frequency tuning.

Figure 5A:
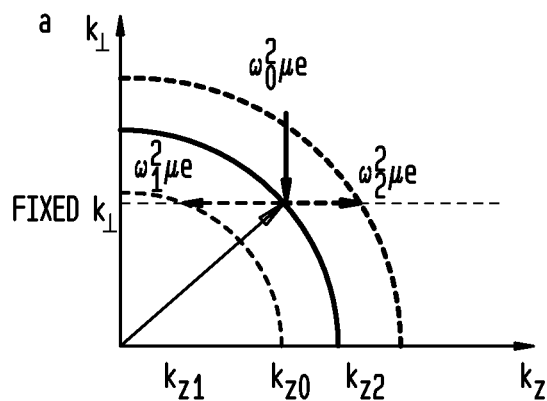
FIG. 5A graphically illustrates a conventional method for frequency tuning by changing a longitudinal wave vector of radiation within an active medium.
Figure 5B:
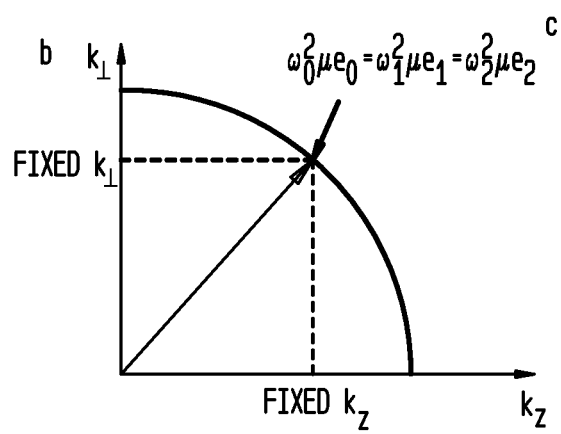
FIG. 5B graphically illustrates another conventional method for frequency tuning by changing the dielectric constant of the lasing medium.
Figure 5C:
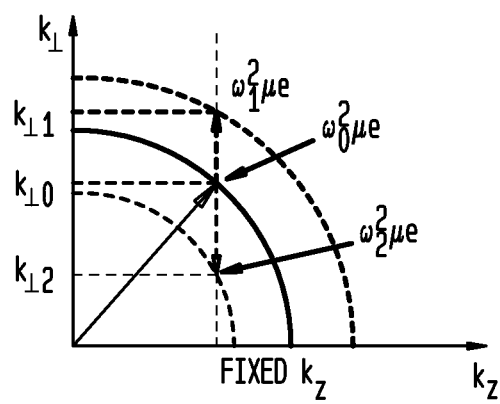
FIG. 5C graphically illustrates a method for frequency tuning according to the teachings of the invention in which the frequency is changed by directly changing a transverse wave vector of the radiation within an active medium.

By way of further illustration, FIG. 5A schematically depicts that in most commonly used conventional frequency tuning mechanisms, both $k_\perp$ and $\in$ are fixed and the tuning of the laser frequency is achieved by changing $k_z$, e.g., by changing the cavity length of a Fabry-Pérot laser or by changing the center wavelength of distributed Bragg reflectors (DBRs), or changing the angle of an external cavity grating. With reference to FIG. 5B, in another conventional mechanism, frequency tuning is achieved by changing the dielectric constant of the lasing medium ($\in$), e.g., by temperature tuning or electrical bias. In contrast, with reference to FIG. 5C, in a tuning mechanism according to many embodiments of the invention, the frequency of a wire laser is tuned by directly changing the transverse wave vector $k_\perp$.

As discussed above, the teachings of the invention can be employed to provide frequency tuning of a variety of wire lasers adapted to generate radiation in different portions of the electromagnetic spectrum.

Figure 6A:
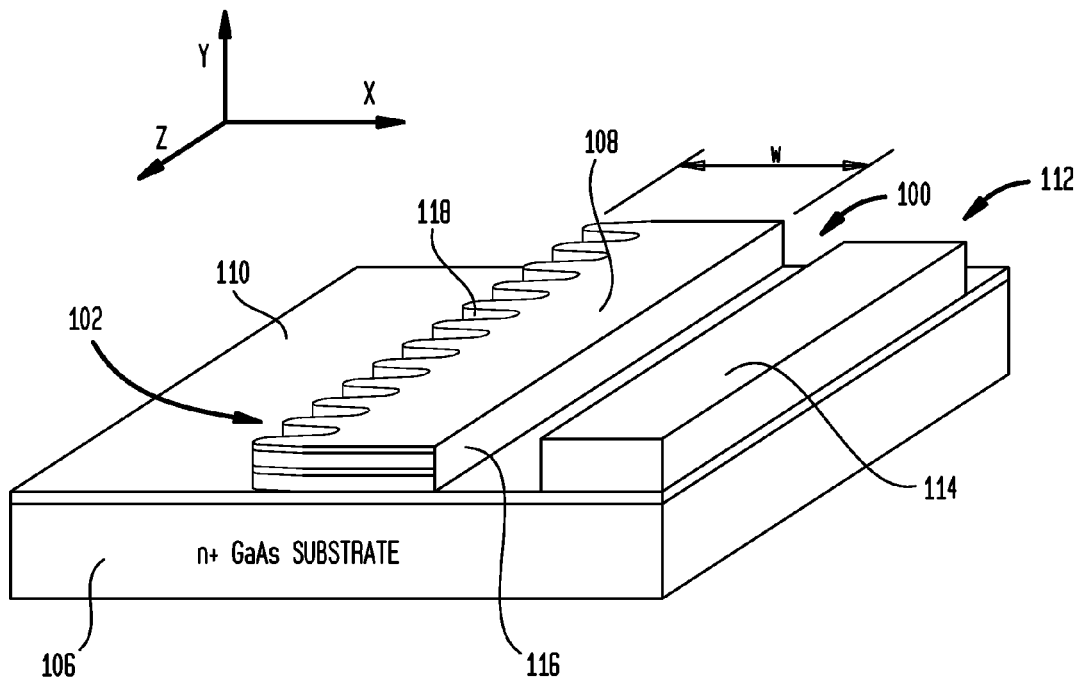
FIG. 6A schematically depicts a frequency tunable quantum cascade terahertz wire laser according to an embodiment of the invention.

By way of example, FIG. 6A schematically depicts a semiconductor wire laser 100 according to an embodiment of the invention that includes an active lasing medium 102 for generating radiation in a frequency range of about 1 THz to about 10 THz. In this exemplary embodiment, the semiconductor laser 100 comprises a quantum cascade laser in which the lasing medium 102 includes an active lasing region that is formed as a heterostructure on an underlying substrate 106. More specifically, with reference to FIG. 6B, in this exemplary implementation the active lasing region 102, which can have a thickness in a range of about 3 microns to about 10 microns, includes a plurality of cascaded nominally identical repeat lasing modules 104 that are coupled in series. The number of lasing modules 104 can range, for example, from about 100 to about 200.

In this exemplary embodiment, each lasing module 104 is formed of a GaAs/$Al_{0.15}Ga_{0.85}$As heterostructure. For example, each lasing module 104, which can have an approximate thickness of about 600 angstroms, is formed as a stack of alternating $Al_{0.15}Ga_{0.85}$As and GaAs layers having the illustrated thicknesses. The heterostructure of each lasing module 104 provides quantum wells that collectively generate lasing and relaxation states.

The frequency tunable terahertz quantum cascade laser 100 further includes a double metal waveguide formed of metal layers 108 and 110 that confine the laser mode within the lasing medium in one transverse direction (labeled herein as the x-direction). Further details regarding the structure of the lasing medium as well as the double metal waveguide can be found in U.S. Pat. No. 7,548,566 entitled "Terahertz lasers and amplifiers based on resonant optical phonon scattering to achieve population inversion," which is herein incorporated by reference in its entirety.

As discussed in more detail below, the laser mode in the other transverse direction (labeled herein as the y-direction) is not entirely confined within the lasing medium 102, but rather extends beyond the lasing medium 102 as a propagating evanescent wave. More specifically, the width (w) of the lasing medium 102 is significantly less than a wavelength of the laser radiation (e.g., by a factor of at least about 5 or at least about 10) in the lasing medium 102, thus resulting in a substantial fraction of the laser radiation propagating as an evanescent wave.

Similar to the above frequency tunable laser 10, the tunable terahertz laser 100 illustrated in FIG. 6A also includes a frequency tuning mechanism 112 for interacting with the evanescent propagating wave of the laser mode in order to tune the laser frequency in a manner discussed above. For example, as discussed in detail above, the frequency tuning mechanism 112 can include a metal or a semiconductor plunger 114 movable relative to the lasing medium 102 that can modulate the confinement of the transverse laser mode (in this case, the transverse mode along the x-direction) in the lasing medium 102, thereby tuning the laser frequency.

Further, in this exemplary implementation, the lasing medium 102 includes a flat side 116 and a corrugated side surface 118 so as to provide an asymmetric DFB for achieving single mode operation, and further facilitating the frequency tuning of the laser 100 in a manner discussed above.

A variety of frequency tuning mechanisms can be employed in tunable wire lasers according to the teachings of the invention. By way of example, in some implementations, the tunable mechanism can be formed as a microelectromechanical systems (MEMS). By way of example, in some embodiments, the frequency tuning mechanism can include a MEMS-based plunger that is suspended over the device wafer, e.g., by a distance of about 1 micron, so as to minimize, and preferably eliminate, friction between the plunger and the device substrate.

Figure 7A:
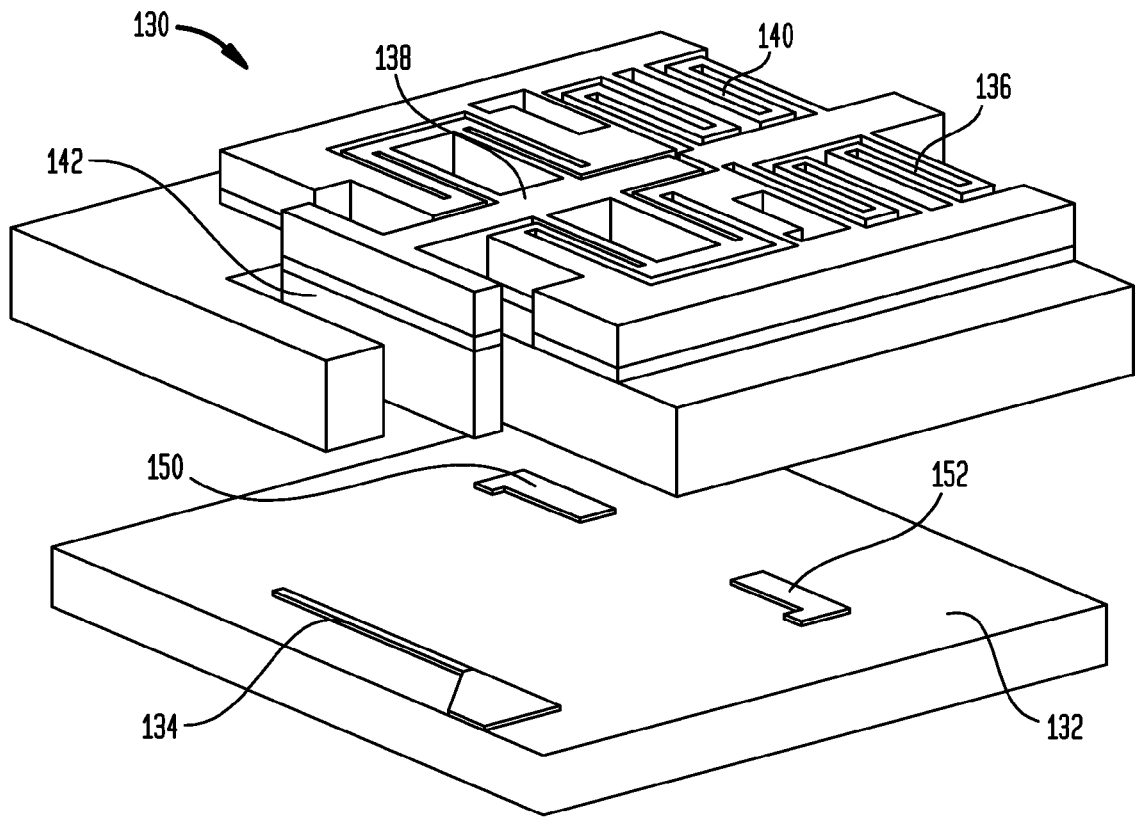
FIG. 7A schematically shows a MEMS-based tuning mechanism suitable for use in a tunable wire laser according to the teachings of the invention and a device wafer to which the MEMS-based mechanism can be coupled.
Figure 7B:
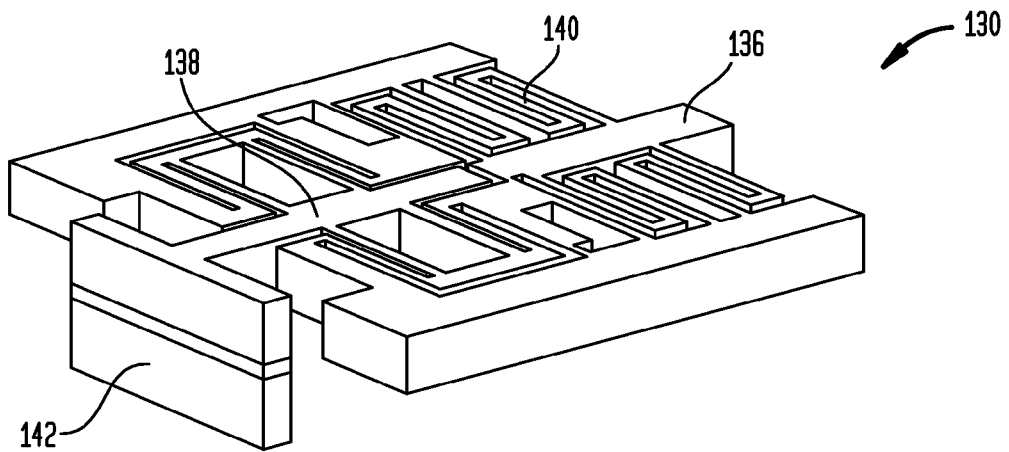
FIG. 7B schematically depicts two spring stages of the MEMS-based tuning mechanism of FIG. 7A.

By way of example, FIGS. 7A and 7B schematically show a MEMS-based plunger 130 according to an embodiment of the invention as well as a device substrate 132 on which a wire laser 134 is formed and to which the MEMS-based plunger 130 can be coupled, as discussed in more detail below. The plunger 130 includes a first stage 136 and a second stage 138. The first stage 136 includes a three-fold spring 140 to achieve a larger displacement than the second stage 138 (e.g., the first stage can achieve a displacement of about 30 microns while the second stage achieves a displacement of about 20 microns) and to isolate any misalignment between an external actuator (not shown), such as a differential micrometer, and the second stage 138. The second stage 138 in turn employs a double-folded beam design that provides a stiffer structure in the transverse direction. In this implementation, the second stage includes a side surface 142 that is coated with a metal, e.g., gold, that can interact with a propagating evanescent wave of the laser radiation. In this implementation, the first and second stages 136, 138 are formed of silicon. A sidewall 142 of the plunger 130 is formed of a top layer of silicon, a relatively thin layer of $SiO_2$, followed by a relatively thick layer of silicon coated with a layer of gold between the silicon and the flat side of the wire laser 134. The substrate 132 is formed of GaAs coated with a layer of gold between the MEMS-based plunger 130 and the GaAs.

Figure 7C:
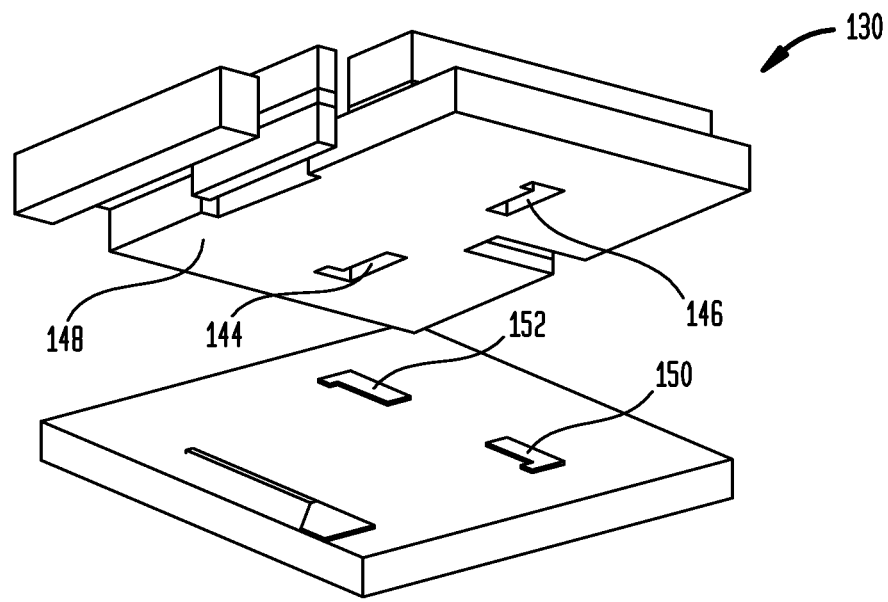
FIG. 7C schematically illustrates that the MEMS-based tuning mechanism of FIG. 7A can be aligned relative to the device wafer by engaging two poles on the wafer with two openings in the actuator.

As shown in FIG. 7C, the plunger 130 includes two openings 144 and 146 at a bottom surface 148 thereof that are configured for engagement with two poles 150 and 152, formed, e.g., of gold, on the device substrate in order to assemble the plunger with the device substrate.

Figure 7D:
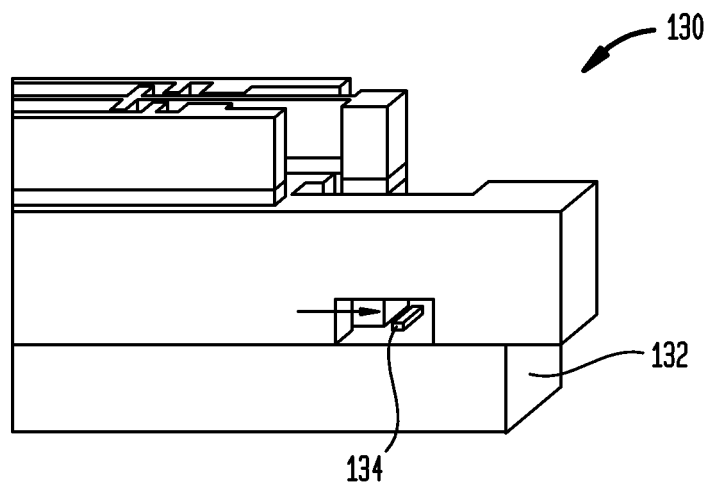
FIG. 7D schematically shows the MEMS-based tuning mechanism and the device wafer of FIG. 7A in an assembled configuration.

FIG. 7D schematically depicts an assembled device in which the MEMS-based plunger 130 can be moved relative to a side surface of the wire laser 134 (e.g., the flat surface of a DFB laser ridge) to tune the frequency of the laser radiation. For example, an external actuator (not shown), such as a mechanical drive (e.g., a differential micrometer), can apply a force, e.g., a compressive force, to the first stage 136, to cause it to move, e.g., with a moving range of about 25 microns. The first stage 136 in turn applies a force to the second stage 138 so as to move the second stage 138, and consequently the gold-coated side wall 142, from its free-standing position along a transverse direction towards a side surface of the laser 134 (e.g., the flat surface of a DFB laser ridge). Conversely, the lowering of the compressive force (e.g., adjusting a micrometer in a reverse direction) can cause relaxation of the spring structures so as to retrieve the plunger surface 142 back to its free-standing position. In this manner, the gold-coated side wall of the plunger 130 can interact with a transverse propagating evanescent field of the laser radiation for tuning the laser frequency. In this manner, the frequency tuning of the laser 134 can be made reversibly.

In some implementations, at a free-standing position, the plunger surface 142 can be at a distance in a range of about 15 microns to about 20 microns from the side surface of the laser 134. In some cases, tuning of the laser frequency over the desired range can be achieved by changing the distance between the plunger surface 142 and the laser side surface over a range of about 5 to about 10 microns provided, e.g., that the plunger surface 142 is parallel with the DFB laser ridge to within about 1 degree. The use of the two stages 136 and 138 advantageously allows achieving such a high precision and a large moving range. In particular, as noted above, the second stage 138 is stiffer and hence its alignment with the laser side surface can be more readily retained.

In some embodiments, the mechanical design of the flexure stages 136 and 138 can be facilitated by using finite-element (FEM) simulation using, e.g., a commercial software package such as FEMLAB 3.5 marketed by Comsol Inc. of Burlington Mass., U.S.A. By way of example, the simulation can be employed to choose the proper thickness and length of the flexure stages such that the maximum stress in the structure would be much smaller than the yield stress, which was chosen to be about 250 MPa. In some embodiments, in the fabrication process, a series of different widths can be tried in order to determine the optimal width. In MEMS flexure design, sharp edges in a structure are generally avoided as sharp edges can lead to stress concentration and unpredictable fabrication results. Hence, in many implementations, the corners of the flexure structures are rounded, e.g., with a filler having a 20-μm radius.

By way of illustration, FIGS. 8A-8C show exemplary simulation results for a double-folded beam implementation of the second flexure stage 138 having a width of 20 microns and a length of 750 microns. FIG. 8A shows the deformed shape of the beam structure, which can achieve a displacement range of about 20 microns. FIG. 8B shows the calculated von Mises stress in the structure, and FIG. 8C shows enlarged view of the stress concentration near the corners.

With reference to FIGS. 9A-9C, in one method for fabricating the MEMS-based plunger, a Silicon-On-Insulator (SOI) wafer 160 is provided, which includes a silicon (Si) device side 162, a Si handle side 164 and a silicon oxide layer 166 that separates the device side 162 from the handle side 164. By way of example, the device side 162 can have a thickness of about 50 microns and the handle side 164 can have a thickness of about 400 microns. Initially, with a photoresist as a mask, a trench 168 can be formed in the silicon device layer 162, as shown in FIG. 9B, by employing continuous dry-etching to avoid contact between the plunger 160 and the device wafer (i.e., the wafer on which the wire laser is located) when the plunger 160 is assembled to the device wafer.

Subsequently, an $SiO_2$ layer, e.g., one having a thickness of about 2 microns, can be deposited on each side of the wafer (i.e., the device side 162 and the handle side 164) and annealed, e.g., at a temperature of about 100° C. The $SiO_2$ layer 166 can be patterned by standard lithography and BOE (Buffered Oxide Etchant) wet etching. By way of illustration, FIG. 9C shows exemplary patterned SiO$_2$ layer 170.

Subsequently, as illustrated in FIG. 9D, a thick photoresist layer 172, e.g., one having a thickness of about 1 micron, can be spun on the handle side 164 of the wafer and patterned. The combined masks of the photoresist 172 and the SiO$_2$ 170 can be used to define the step structure in the handle side 164 of the wafer. The wafer can then be loaded into an etcher (e.g., an inductive coupled plasma-reactive ion etching device, such as STS ICP-RIE etcher) to be etched, e.g., for 200 microns, with a calibrated recipe of DRIE (deep RIE). This can be followed by stripping the photoresist 172 as shown in FIGS. 9E and 9F, and etching the handle side 164 of the wafer again for 200 microns until the etched portions reach the embedded SiO$_2$ 166. DRIE can then be used to define the desired pattern on the device side with the SiO$_2$ 166 as the hard mask. Next, buffered oxide etchant and critical point releasing apparatus can be used to release the embedded SiO$_2$ 166 to prevent the movable structure from sticking to the bottom substrate. Finally, the side of the plunger that will face the DFB laser ridge upon assembly of the plunger with the device wafer can be coated with a metal, e.g., Ti/Au, by employing known techniques, such as e-beam evaporation.

The MEMS structure can be assembled to the device wafer and aligned with the laser. For example, referring again to FIG. 7C, the alignment poles 150, 152 on the device wafer and the matching holes 144, 146 on the MEMS wafer can be utilized to align the plunger 130 with the laser 134 and to retain the two wafers fixed relative to each other. The free movable plunger 130 can then be moved by an external actuator, e.g., a differential micrometer, and pulled back by the MEMS springs when the micrometer is dialed back.

Figure 10A:
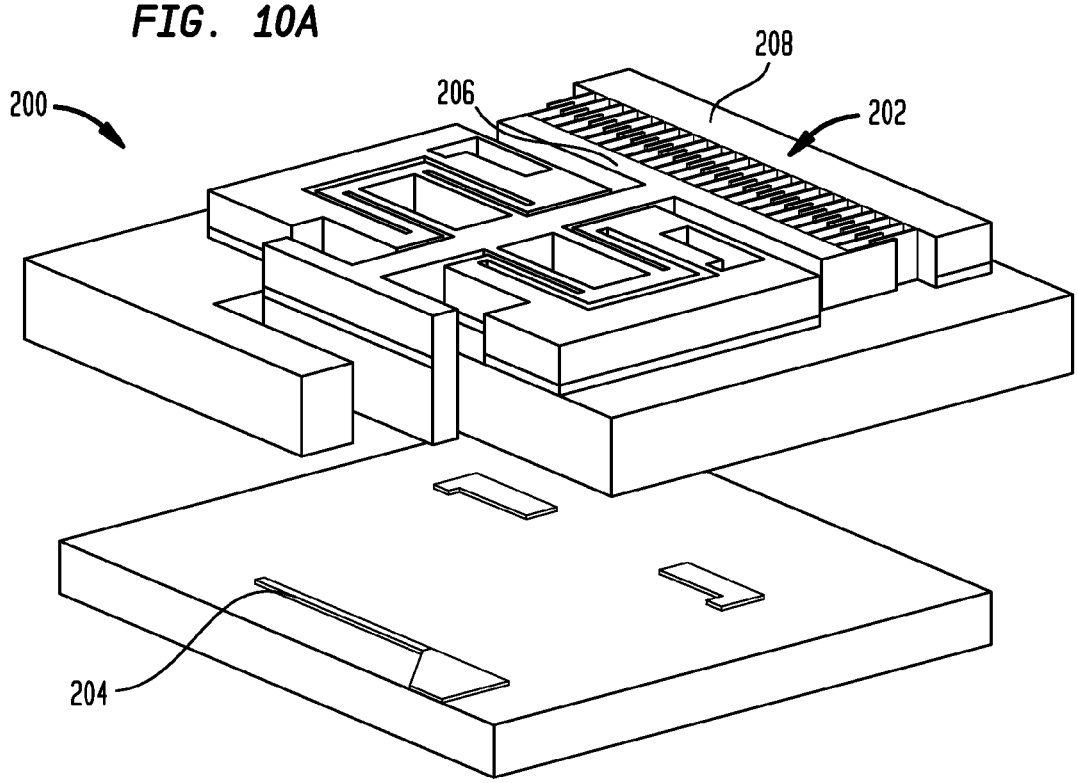
FIG. 10A schematically shows a MEMS-based tuning mechanism according to anther embodiment, which includes an integrated comb-drive actuator.

In some embodiments, a MEMS plunger with integrated comb-drive actuator can be employed for electronically tuning the frequency of a wire laser according to the teachings of the invention. By way of example, FIG. 10A schematically depicts an example of such a plunger 200 that includes a comb-drive actuator 202 having movable set (rotor) 206 comb fingers that are engaged with a stationary set (stator) 208 of comb fingers. A ground plate (not shown) is located under the comb fingers, which is normally connected to the same potential as the rotor 206 in order to prevent application of electrostatic pull-down forces to the substrate. The electrostatic force of the comb-drive 202 can provide the actuation force for moving the movable spring stages of the plunger 200.

Figure 10B:
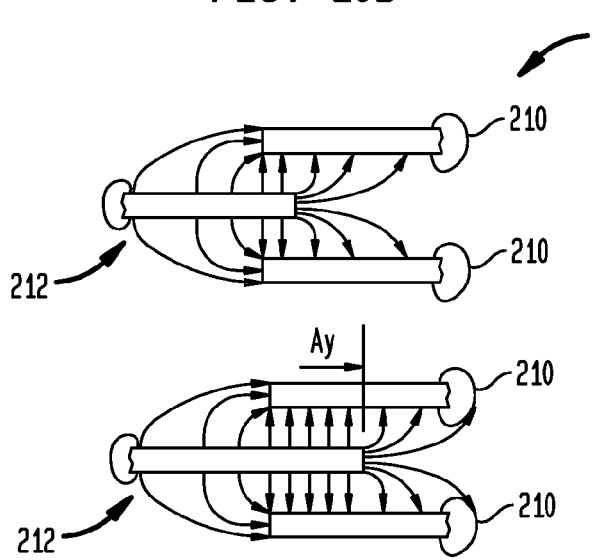
FIG. 10B schematically shows theoretically calculated electric field lines for two positions of an engaged pair of fingers in one unit cell of the comb-drive actuator of FIG. 10A.
Figure 10C:
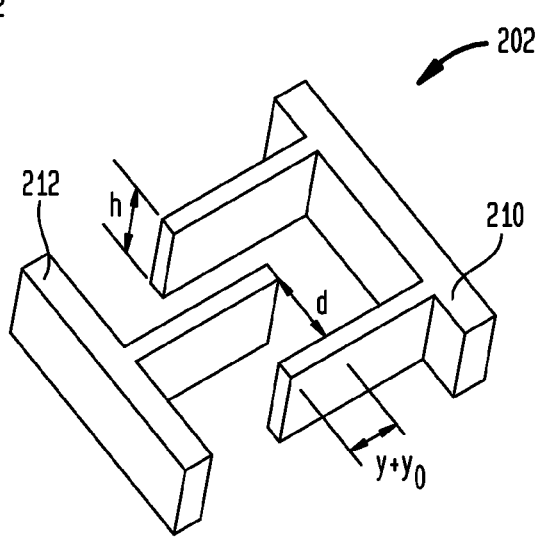
FIG. 10C schematically shows a perspective view of an engaged pair of fingers in one unit cell of the comb-drive actuator of FIG. 10A.

By way of further illustration, FIGS. 10B and 10C schematically show an engaged pair of fingers 210, 212 in one unit cell of the comb-drive actuator 202, which can be analyzed as a parallel-plate capacitor. In some implementations in which voltage control is employed, the lateral electrostatic force in the y-direction, which is equal to the negative derivative of the electrostatic coenergy with respect to the y-direction, is attractive. This force acts on the rotor 206, which is directly connected to the spring structure that moves the plunger 200. By way of illustration in FIG. 10C, a simple model that neglects the fringing fields can be employed to estimate the required number of fingers in the comb-drive actuator 202. For example, for a maximum displacement of about 20 microns, a comb height of about 50 microns, a separation distance d of about 6 microns, and a drive voltage of about 100 volts, the required number of fingers can be estimated to be about 300.

In some embodiments, the output radiation generated by a tunable wire laser according to the teachings of the invention can be coupled into an amplifier, e.g., in a master-oscillator-power-amplifier configuration, so as to amplify the radiation. In some cases, the amplification stage can also improve the beam pattern of the laser radiation.

Figure 11:
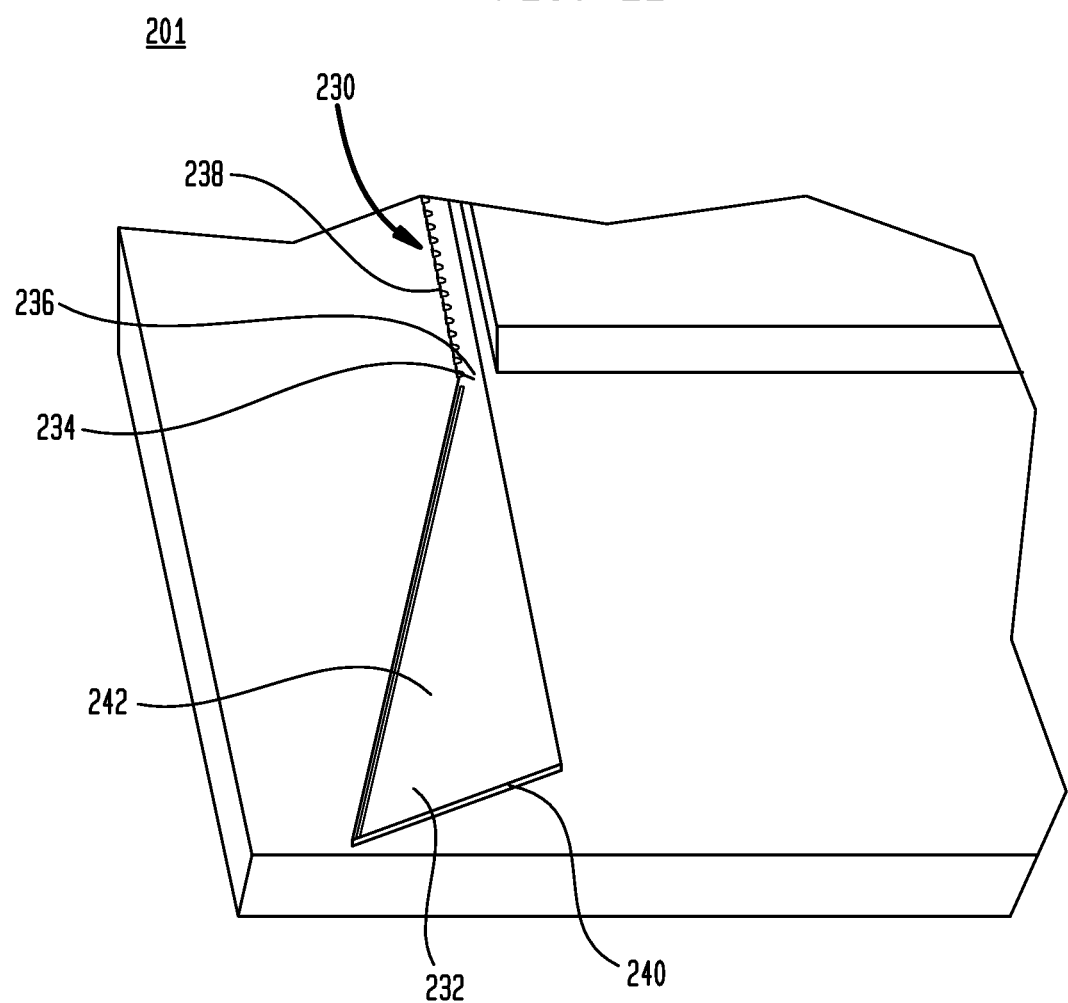
FIG. 11 schematically depicts a tunable wire laser according to an embodiment of the invention in which the output of an active medium is coupled to an amplifier.

By way of example, FIG. 11 schematically illustrates a laser device 201 according to such an embodiment of the invention that includes a tunable wire laser 230 according to the teachings of the invention, such as the above THz tunable wire laser, whose output is optically coupled to a power amplifier 232 (e.g., in this implementation an input facet 234 of the amplifier 232 is attached to an output facet 236 of the wire laser). In this embodiments, the wire laser 230 has a DFB grating 238 and the amplifier 232 has a tapered configuration with its output facet 240 anti-reflection (AR) coated and tilted relative to the DFB ridge 238 to prevent direct reflection of radiation back to the DFB oscillator. Further, to avoid oscillations in the amplifier 232, an absorbing layer 242 can be placed on a top surface of the amplifier 232 along its slanted edge. The absorbing layer 242 can dampen any residual reflection from the tilted output facet 240 of the amplifier 232 to prevent lasing oscillation in the amplifier 232. By way of example, the absorbing layer 242 can be a thin heavily-doped GaAs layer having a thickness of, e.g., about 0.1 microns uncovered with metal so the electric field will not be shorted by it.

Figure 12:
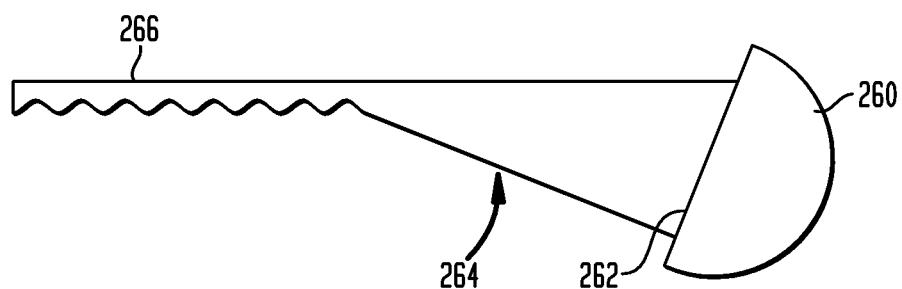
FIG. 12 schematically shows another embodiment of the tunable wire laser of FIG. 11 in which a hemispherical lens is coupled to an output facet of the amplifier.

With reference to FIG. 12, in some implementations, a lens 260, e.g., a hyperhemispherical lens formed of silicon, can be optically coupled, e.g., attached, to an output facet 262 of an amplifier 264 to increase the radiation output power level of the wire laser 266 and to reduce the divergence of the output beam. Further details regarding examples of the lens 260 and its use can be found in published U.S. Patent Application No. 2010/0002739 entitled "Lens Coupled Quantum Cascade Laser," which is herein incorporated by reference in its entirety.

Figure 13A:
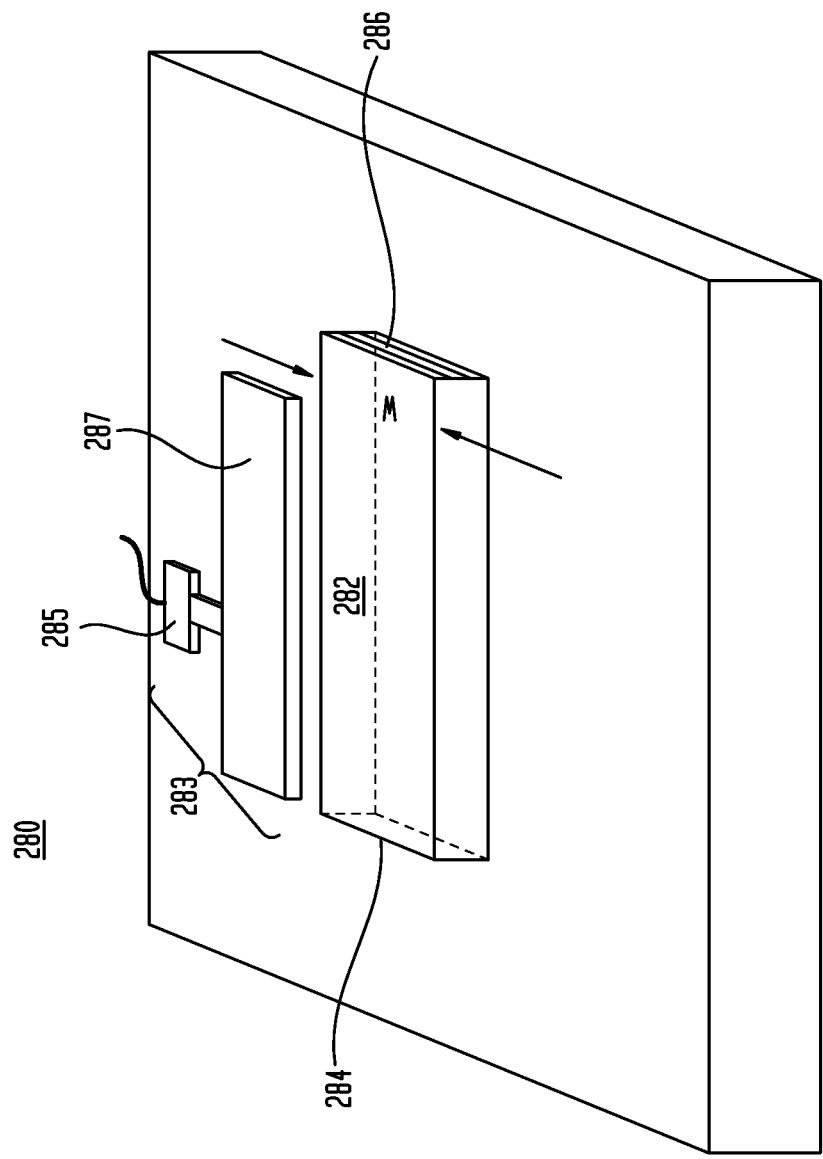
FIG. 13A schematically depicts a tunable semiconductor incoherent radiation source according to an embodiment of the invention.

The teachings of the invention are not limited to coherent radiation sources, but rather can be employed to fabricate frequency tunable semiconductor incoherent radiation sources. By way of example, FIG. 13A schematically depicts a tunable semiconductor incoherent radiation source 280, such as a frequency tunable amplified stimulation emission (ASE) device, according to an embodiment of the invention that includes a semiconductor active medium 282 that is configured for generating radiation in a desired frequency range, e.g., in a range of about 1 THz to about 10 THz, or the visible range of the electromagnetic spectrum. Input and output facets 284 and 286 of the active medium can be cleaved and otherwise configured to prevent lasing oscillation in the active medium. For example, the output facet 286 can be anti-reflection coated to minimize reflection feedback from that facet into the active medium.

The active medium 282 has a width (w) that is much smaller than the wavelength of radiation ($\lambda$) in the active medium. For example, the width (w) can be at least about 5 times, or at least about 10 times, less than the wavelength of the radiation within the active medium. Hence, a fraction of radiation propagates as an evanescent propagating wave outside the active medium 282. A frequency tuning mechanism 283 external to the active medium 282, such as the mechanisms discussed above, interacts with the propagating evanescent wave so as to tune the frequency of the radiation. More specifically, an actuator 285 can be employed to change the distance between a tuning element 287 of the tuning mechanism and a side surface of the active medium so as to change the transverse mode profile of the radiation, thereby adjusting the radiation frequency.

Figure 13B:
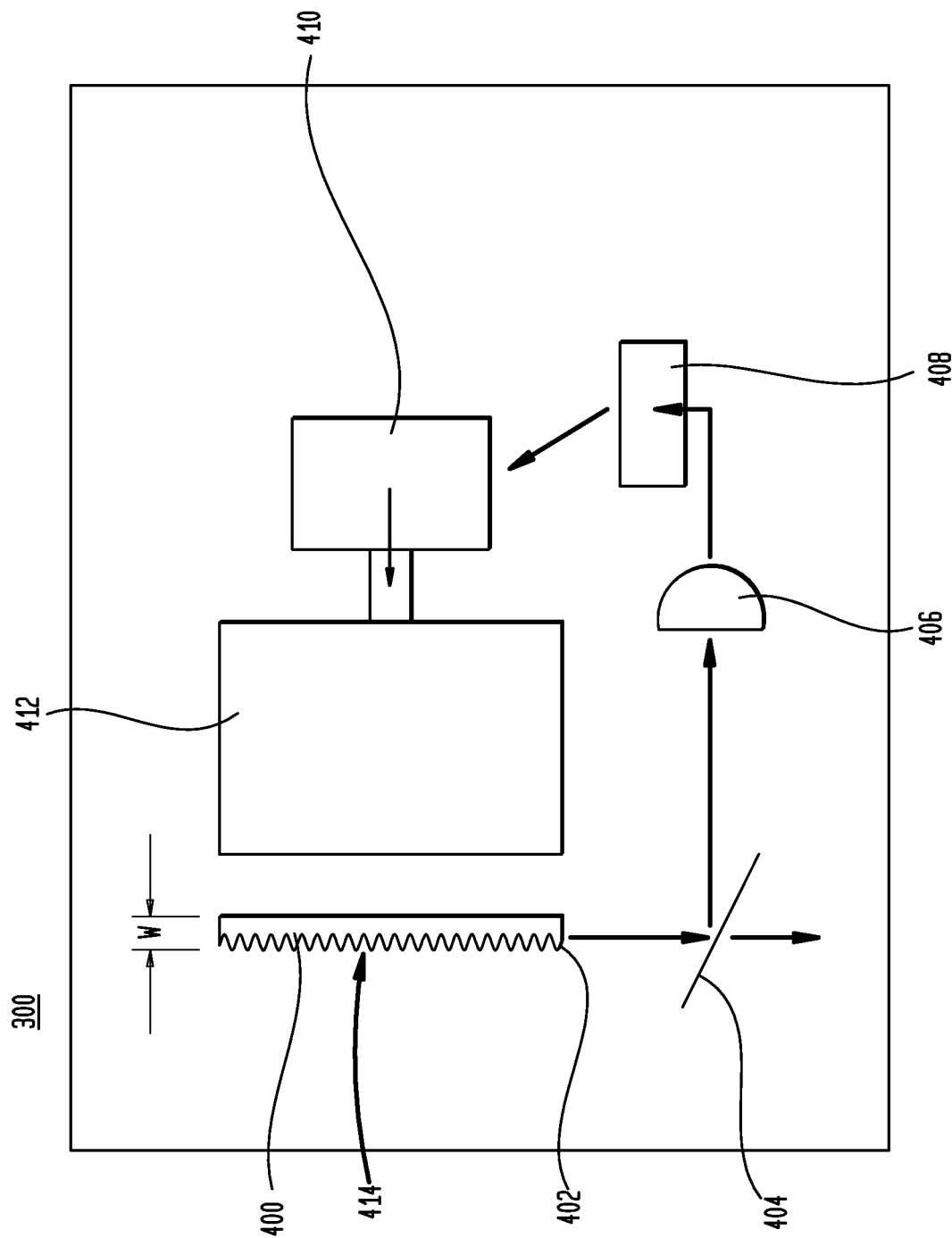
FIG. 13B schematically shows a frequency stabilized wire laser according to an embodiment of the invention.

In other aspects, the invention provides frequency stabilized radiation-generating semiconductor sources in which the frequency is stabilized via a feedback loop that adjusts a transverse mode profile of radiation within an active medium. By way of example, FIG. 13B schematically depicts a frequency stabilized wire laser 300 according to an embodiment of the invention that includes an active medium 400 for generating laser radiation with a frequency in a desired range, e.g., in a range of about 1 THz to about 10 THz. In this embodiment, the active medium 400 includes a DFB structure 414 that ensures single mode lasing. The active medium 400 has a width (w) that is significantly less than the wavelength of radiation within the medium 400 (e.g., at least about 5 times or at least about 10 times less than the wavelength). Hence, a fraction of the laser radiation propagates outside the active medium 400 as a propagating evanescent wave.

The laser radiation leaves the active medium 400 through an output facet 402 thereof. A beam splitter 404 directs a small portion of the laser radiation to a spectrometer 406 that determines the frequency of the laser radiation. The spectrometer 406 communicates the measured frequency to a processor 408, which in turn compares the measured frequency with a predefined value. If the processor 408 determines a deviation between the measured and the predefined frequencies, it sends a signal to an actuator 410 coupled to a tuning element 412 to cause the movement of the tuning element 412 towards or away from the active medium 400. In this manner, the tuning element 412 can interact with a propagating evanescent wave to adjust the frequency to the predefined value.

The following example is provided to further illustrate the salient features of the invention. The example is provided only for illustrative purposes and is not intended to necessarily indicate optimal structures and results that can be obtained by practicing the teachings of the invention.

EXAMPLE

Figure 6B:
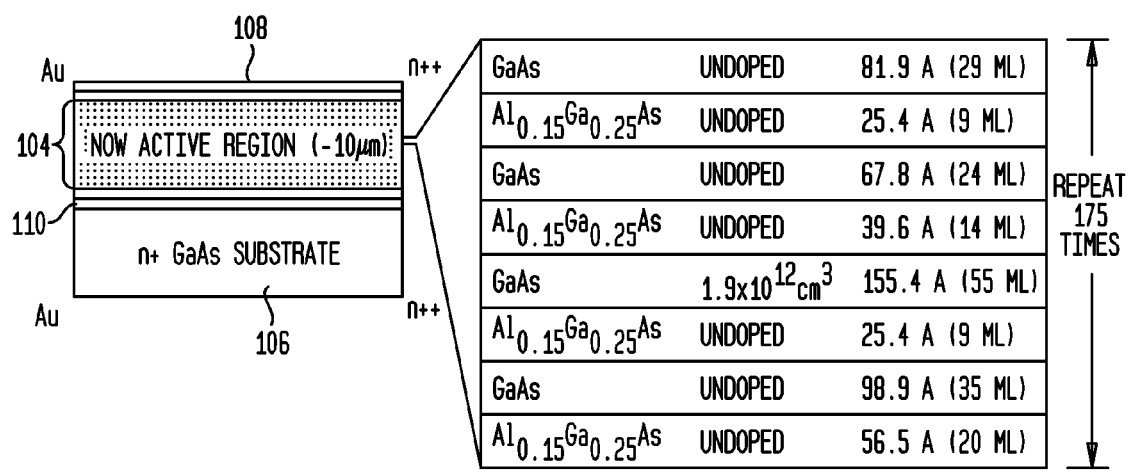
FIG. 6B is a cross-sectional view of the active medium of the laser of FIG. 6A, illustrating the heterostructure composition of one of the lasing modules of the active medium.

A prototype frequency tunable semiconductor quantum cascade laser operating in the terahertz portion of the electromagnetic spectrum was fabricated according to the above teachings of the invention. This prototype device included an active region (herein also referred to as the THz gain medium) formed as a stack of lasing modules, each of which was formed as heterostructure of alternating layers of $Al_{0.15}Ga_{0.85}As$ and GaAs (the layer composition of one of the heterostructures is shown in FIG. 6B above). The active region was formed as a ridge waveguide on an underlying n+GaAs substrate having a thickness of about 100 microns by employing molecular beam epitaxy. A double-metal waveguide formed by wafer bonding and substrate removal, with one layer deposited in top and the other on the bottom of the active region was employed for mode confinement along the height of the active region. A Fabry-Perot cavity was formed by cleaving the proximal and distal ends of the ridge waveguide to form a back and front facet. The back facet was metalized with a coating of gold.

As illustrated in FIGS. 14A-14D, an asymmetric first-order distributed feedback grating (DFB) was fabricated in the active region, e.g., in a manner discussed above, to ensure single mode lasing. The asymmetric DFB included a corrugated structure 300 formed on a side surface of the active region. The opposed side surface 302 of the active region was flat. The DFB corrugation 300 was in the form of sinusoidal modulation, which was chosen to provide for a smooth undulating side wall. The laser ridge had an average width of about 12.5 µm, sinusoidal grating modulation of 3 µm, 30 periods and a grating period of $\Lambda=13.7$ µm. The height of the gain medium was ~10 µm.

The front facet 304 of the laser ridge was chosen to be the widest part of the DFB grating to increase the radiation loss of the lower band-edge mode and its lasing threshold. The rear facet of the laser ridge 300 was defined using wet etching with a slope so that a bonding pad 306 could be fabricated away from the laser ridge 300 and the electrical contact to the device mount 308 could be made without interfering with the movement of a plunger 310 utilized for frequency tuning, as discussed below. The rear facet was metalized with gold to facilitate forming an electrical contact with the bonding pad 306.

Figure 14A:
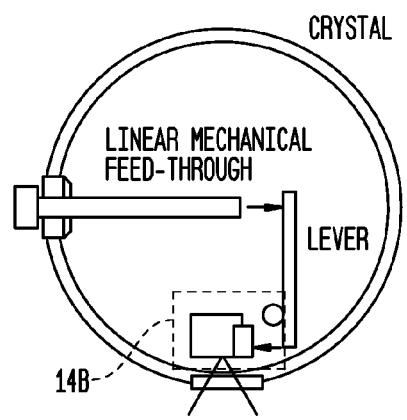
FIG. 14A schematically illustrates a prototype tunable wire laser according to the teachings of the invention in which a differential micrometer is used to push the long end of a lever, the short end of which in turn pushes a plunger towards an active medium to change the frequency of the laser radiation.
Figure 14B:
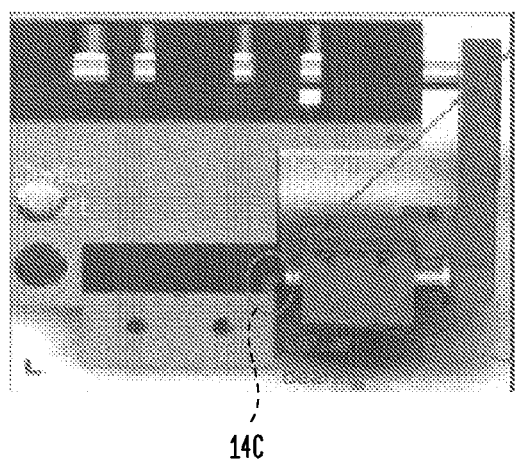
FIG. 14B depicts an experimental three-dimensional device mount and mechanical module utilized in the prototype device of FIG. 14A.
Figure 14C:
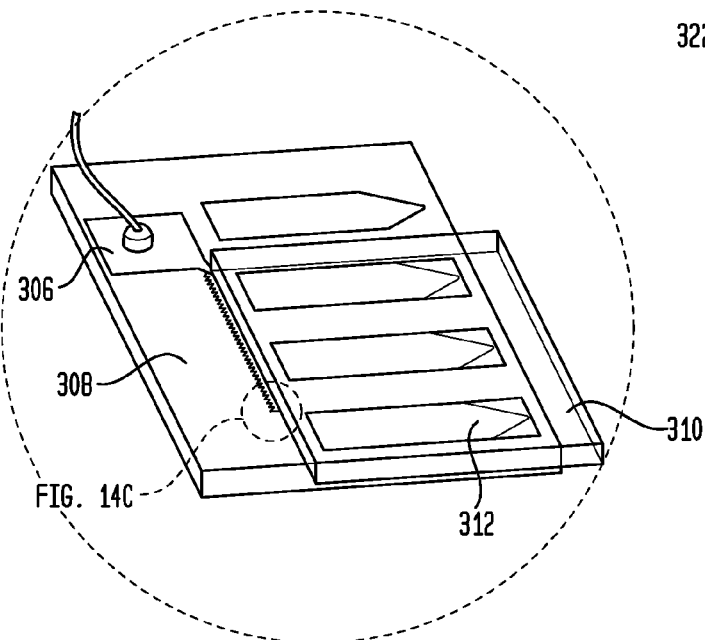
FIG. 14C schematically illustrates the device region in FIG. 14B, showing the plunger lying on top of guide rails, ready to be actuated by the shaft of a linear bearing.
Figure 14D:
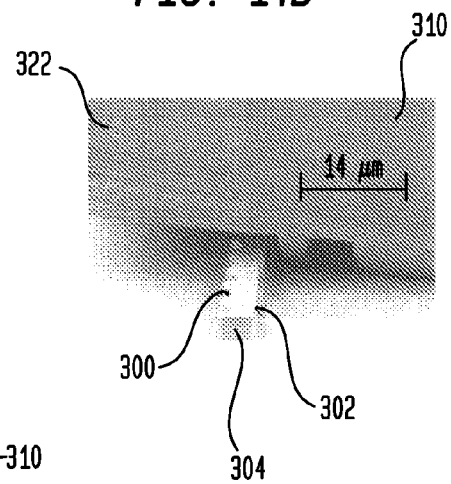
FIG. 14D is an image of an assembled prototype frequency tunable terahertz wire laser according to the teachings of the invention having a silicon plunger as a tuning element.
Figure 15A:
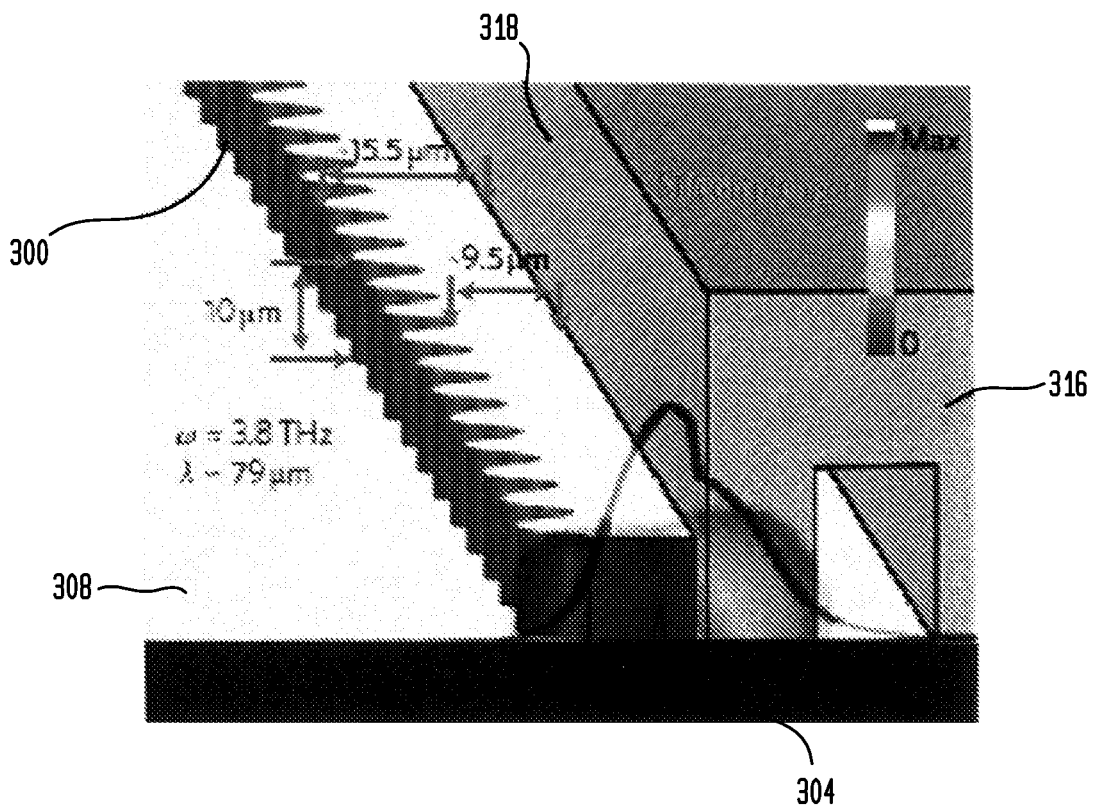
FIG. 15A schematically depicts a terahertz wire laser according to an embodiment of the invention having a corrugated DFB grating and a semiconductor tuning plunger extracting the transverse mode of the laser radiation away from the corrugated surface of the wire laser, thereby decreasing the laser frequency.

A number of guide rails 312 were fabricated by employing dry etching perpendicular to the laser ridge 300 on the device mount 308 for guiding the plunger 310, as illustrated in FIG. 14C. The length of the guide rails 312 was precisely defined to prevent the plunger 310 from contacting the laser ridge 300. A metal plunger 314 and silicon plunger 316 were fabricated for frequency tuning of the laser (See FIGS. 15A and 15B). The side wall 318, 320 of each plunger 314, 316 facing the laser ridge 300 was defined using dry etching, and slots and stoppers were formed along its base to match the guide rails 312 on the device mount 308. For the silicon plunger 316, a reduced width was required, as shown in FIGS. 14D and 15A, so that the mode remained appreciably in the gain medium to achieve lasing. This reduced width was achieved using dry etching. On both plungers 314, 316, a portion 322 overhang the laser ridge, as shown in FIG. 14D. It was determined that the overhang 322 had little effect on the tuning process because it was ~7 µm higher than the top of the laser ridge 300, where the evanescent mode is negligible.

The laser ridge 300 and the plunger 314, 316 were mounted onto a cold plate device mount 308, as illustrated in FIG. 14C. During operation, the particular plunger 314, 316 in use was pressed down onto the device mount 308 so that it could only be pushed toward the laser ridge 300. To overcome the friction between the plunger 314, 316 and the guide rails 312, a piezoelectric-transducer (PZT) bender (P-871.140 Piezo Bender Actuator marketed by PI (Physik Instrumente) of Massachusetts, U.S.A.) and a mechanical differential micrometer shown in FIG. 14B were used. The PZT bender had a continuous displacement range of about 800 in either direction at room temperature. The micrometer had a movement resolution of about 0.5 µm. This resolution was further improved by using a ~4:1 lever, as also shown in FIGURE. 14B, resulting in a ~140 nm step resolution. The mechanical module was made mostly of steel with the exception of the thermal isolator, which was composed of fiber glass.

The device mount was formed from copper and was mounted in a vacuum cryostat during testing, as shown in FIG. 14A. The emitted laser light was collected without any optical components inside the cryostat. All of the spectra were measured at 5 K using a Nicolet 850 spectrometer, which was purged with $N_2$ gas, and a germanium gallium photodetector in pulse mode with a frequency of 90 kHz and a duration of 200 ns.

The design of the DFB/plunger prototype was aided with finite-element (FEM) simulations using a commercial software package (Comsol 3.2). The metal was treated as a perfect conductor and the semiconductor was undoped. The calculated gain threshold $g_{th}$ therefore only reflected radiative losses. For a bare DFB laser, writing $k_z=n_{eff}(\omega/c)=\pi/\Lambda$, an effective mode index of $n_{eff}\approx2.86$ was estimated for the lowest loss mode, which is considerably lower than the refractive index of the active medium ($n_{active}=3.6$ used for calculation) and is indicative of a large fraction of the mode propagating outside the active medium.

In the longitudinal direction under the resonance condition $k_z=\pi/\Lambda$, where $\Lambda$ is the grating period, two standing-wave solutions exist and each at a different frequency, forming a bandgap. The upper band-edge mode has the maximum intensity localized at the narrow part of the grating, which results in a larger value of $k_\perp$. Similarly, the maximum intensity of the lower band-edge mode is located at the wider part of the grating. The front facet 304, from which the radiation is coupled out, is open and can be defined by dry etching. By carefully positioning the front facet 304 relative to the DFB grating 300, either the lower band-edge or the upper band-edge mode will have lower radiation loss, and will be the lasing mode in a single-mode operation.

Figure 15B:
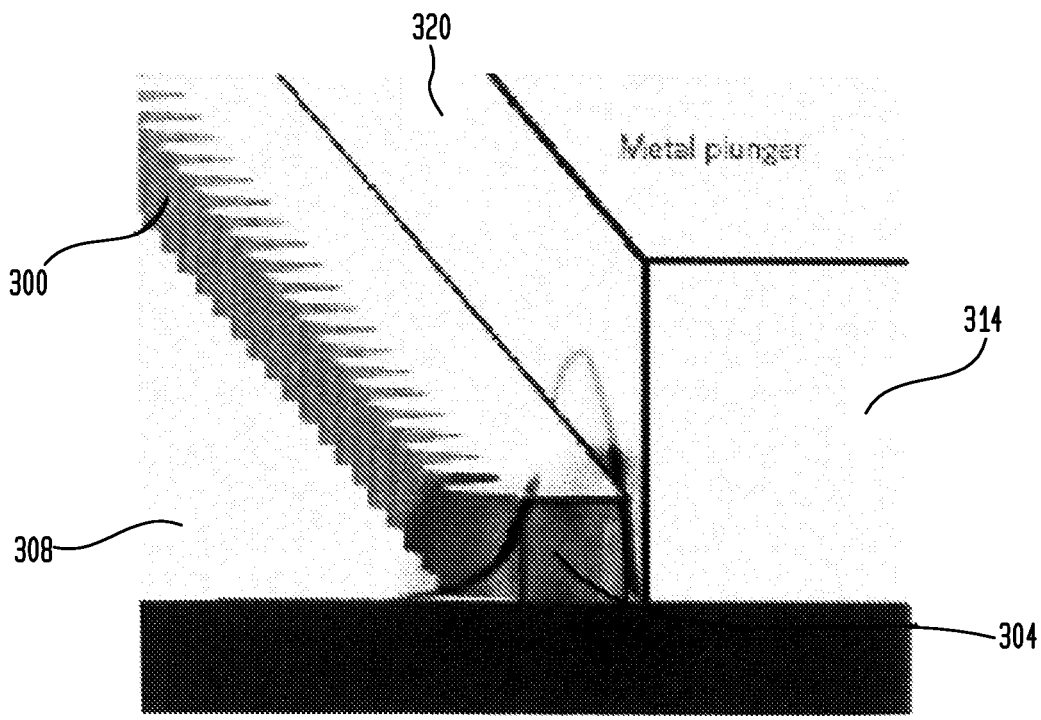
FIG. 15B schematically depicts a terahertz wire laser according to another embodiment of the invention having a corrugated DFB grating and a metal tuning plunger pushing the transverse mode of the laser radiation toward the corrugated surface of the wire laser, thereby increasing the laser frequency.

For this experiment, the upper band-edge mode was chosen to be the lasing mode to enhance the tuning range. As the metal plunger 314 was pushed towards the laser, the mode was pushed towards the DFB corrugation as shown in FIG. 15B, increasing its coupling with the grating and therefore the bandgap (from ~260 to ~417 GHz with a gap of 0.5 μm). This increase of the bandgap accentuated the blueshift tuning. Similarly, as the silicon plunger 316 was pushed towards the laser, the mode was extracted away from the DFB corrugation as shown in FIG. 15A and the bandgap shrinks (from ~260 to ~120 GHz with a gap of 0.5 μm), effectively enhancing the redshift tuning. Based on this, the front facet 304 was chosen to be at the widest part of the DFB grating, as shown in FIGS. 15A and 15B, which increased the radiation loss of the lower band-edge mode and its lasing threshold.

Figure 16:
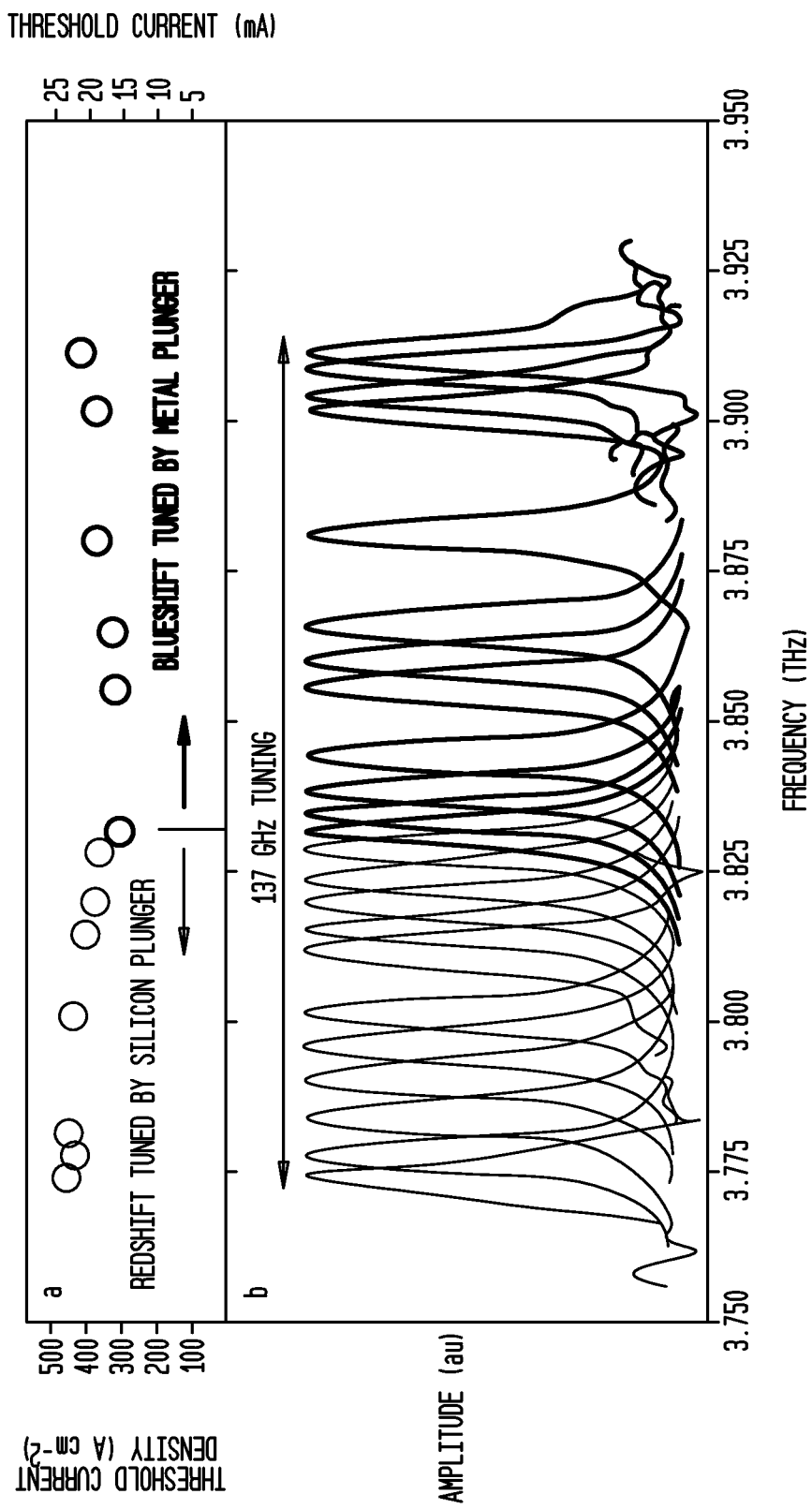
FIG. 16 graphically illustrates experimental results in which the top panel 'a' shows threshold current densities of a prototype terahertz wire laser according to the teachings of the invention at different frequencies, illustrating a moderate increase in the current density as a tuning plunger is pushed towards the laser ridge, and the bottom panel 'b' shows broadband tuning of the laser over a range of about 137 GHz by changing a transverse mode profile of the laser radiation within the laser's active medium.

The results obtained with this prototype, including both redshift and blueshift, from a single device are shown in FIG. 16. Using the plungers 314, 316 described above, a redshift tuning of about 57 GHz and a blueshift tuning of about 80 GHz were achieved. In combination, a total tuning range of about 137 GHz, or ~3.6% fractional tuning, was achieved. During the spectral measurements, both the device bias and the temperature were kept constant, so tuning due to Stark shift and/or temperature was negligible. In fact, the frequency shift of the DFB device with bias, with the plunger in a fixed position, was not measurable within the resolution (3.75 GHz) of the spectrometer. Hence, the frequency shift of the single lasing mode, shown in FIGURE D, can be unambiguously attributed to the tuning of $k_\perp$ by the movement of the plunger.

In this prototype device, the measured power levels change with the plunger position in a complicated way, due to the changes in beam pattern and in atmospheric attenuation with frequency. Also, the absolute power was too low in this experiment to be measurable with a power meter because the assembly required the device to be placed far from the Dewar window and did not allow the use of a collecting optic such as a metallic cone to collect the highly divergent beam emitted from the laser facet. Thus, a more meaningful parameter for characterizing the laser performance is the threshold current at different plunger positions. This result is shown in the upper panel in FIG. 16, which exhibits a moderate increase as either a silicon or a metal plunger is pushed towards the laser ridge. For the silicon plunger 316, this increase is due to a reduction of the mode confinement factor in the gain medium. For the metal plunger 316, the increase of the lasing threshold is likely due to loss of in the metal and a thin SiN insulation layer preventing shorting the plunger with the device.

Figure 17A:
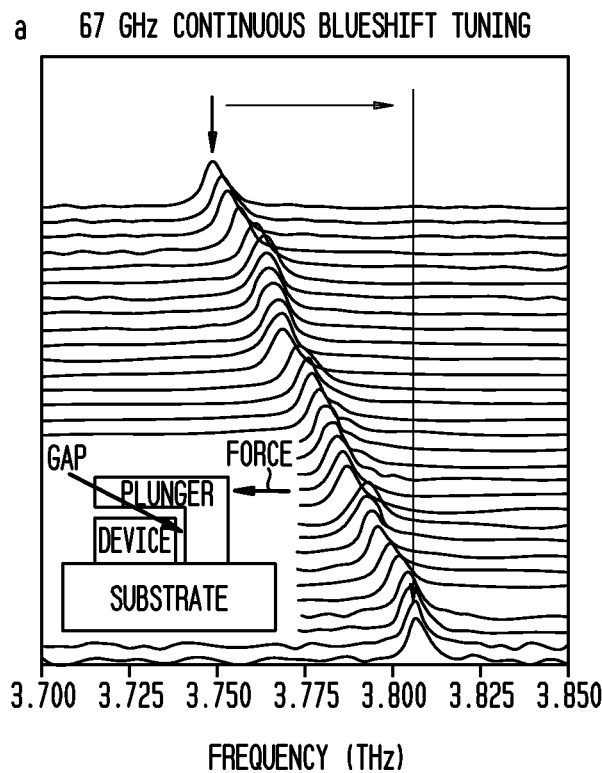
FIG. 17A graphically illustrates experimental results of continuous blueshift tuning of a prototype terahertz wire laser according to the teachings of the invention with a gold plunger over a range of 67 GHz.
Figure 17B:
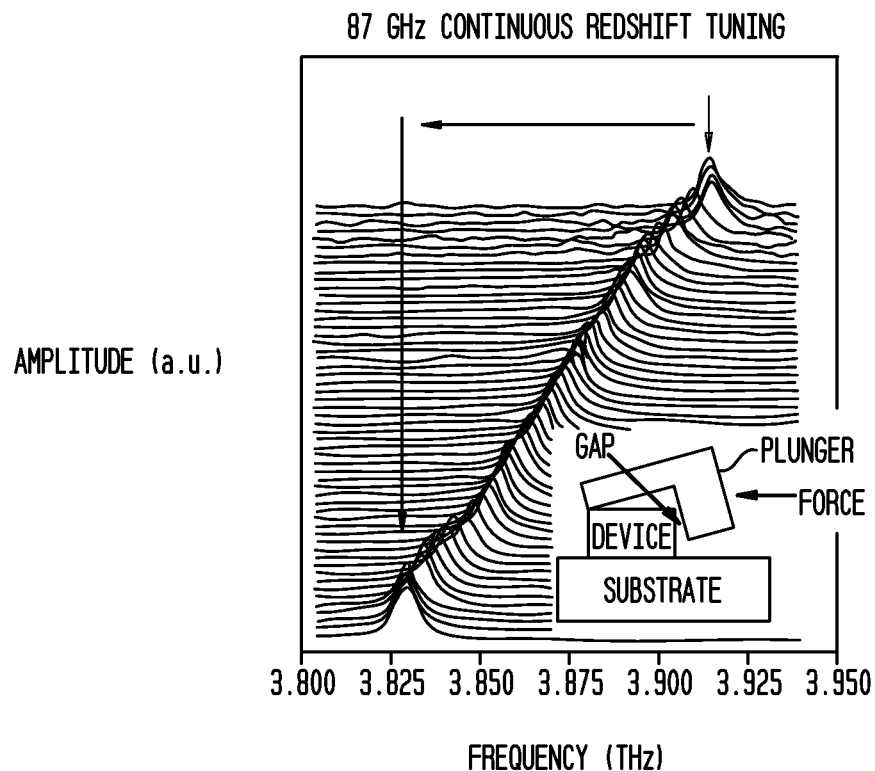
FIG. 17B graphically illustrates experimental results of continuous redshift tuning of a prototype terahertz wire laser according to the teachings of the invention with a gold plunger over a range of 87 GHz.

The tuning spectra shown in FIG. 16 show some discontinuous jumps, likely due to the stick-slip effect of the plunger as it is moved relative to the laser ridge. FIGS. 17A and 17B show clearer continuous tuning, although with smaller tuning ranges, from two measurements on different tunable prototype DFB laser devices. FIG. 17A shows a continuous blueshift tuning using a metal plunger, as expected. The result shown in FIG. 17B is also from a metal plunger. However, it shows a redshift tuning. This puzzling result was understood when the set-up was inspected under a microscope at room temperature. It became clear that the plunger had been tilted inadvertently, and its overhang was hinged on the edge of the laser ridge, as illustrated in the inset in FIG. 17B. As the upper part of the metal plunger is pushed forward, the plunger is further tilted and the effective gap between the plunger and the laser ridge increases, resulting in the observed redshift tuning. Interestingly, free from the friction problem, this scheme allows a reversible tuning, as a retreat of the bender relaxes the tilt of the plunger, yielding a blueshift.

The novel tuning mechanism of laser frequency, demonstrated here by changing $k_\perp$, applies to wire lasers at any frequencies. For recently developed wire lasers at visible frequencies, a scanning probe could be used to manipulate the transverse mode profile to tune the frequency for sensing and spectroscopy at nanometer scales. For terahertz wire lasers, the use of MEMS technology allows for better control of the plunger, resulting in a finer tuning over a broader frequency range in a reversible way. Such a controlled tuning also offers a mechanism for frequency stabilization using feedback control. Finally, the generated tunable single-mode signal from a wire laser can be fed into an integrated terahertz amplifier to produce high-power radiation with good beam patterns. Further information regarding the above prototype devices can be obtained in an article entitled "Tuning a terahertz wire laser," which was published in Nature Photonics, vol. 3, December 2009. This article is herein incorporated by reference in its entirety.

Those having ordinary skill in the art will appreciate that various changes can be made to the above embodiments without departing from the scope of the invention.

What is claimed is:

1. A frequency tunable wire laser, comprising:
   a lasing medium for generating a laser radiation having a transverse mode profile and a frequency, and
   a frequency tuning mechanism external to the lasing medium for changing said transverse mode profile so as to adjust said frequency.

2. The frequency tunable laser of claim 1, wherein a cross sectional dimension of said lasing medium is at least about 5 times less than a wavelength of said laser radiation.

3. The frequency tunable laser of claim 1, wherein a fraction of a laser radiation field of said transverse mode profile extends outside the lasing medium, and the tuning mechanism interacts with said fraction of the laser radiation field for adjusting the frequency.

4. The frequency tunable laser of claim 1, wherein said tuning mechanism is configured to tune the laser frequency without causing a substantial change in a longitudinal mode profile of the laser radiation.

5. The frequency tunable laser of claim 1, wherein the tuning mechanism comprises
   a tuning element configured to be movable relative to said lasing medium, and
   an actuator coupled to said tuning element for moving said tuning element so as to change said frequency as a function of distance of the tuning element relative to the lasing medium.

6. The frequency tunable laser of claim 5, wherein the tuning element is formed of any of a metal or a dielectric material.

7. The frequency tunable laser of claim 6, wherein said frequency tuning mechanism is formed of a semiconductor.

8. The frequency tunable laser of claim 1, wherein said laser comprises a quantum cascade laser.

9. The frequency tunable laser of claim 8, wherein said quantum cascade laser operates in a frequency range of about 1 THz to about 10 THz.

10. The frequency tunable laser of claim 9, wherein said transverse mode profile extends along a width of said lasing medium and further comprising a double metal waveguide coupled to said lasing medium so as to provide mode confinement of the laser radiation in another transverse direction orthogonal to said width.

11. The frequency tunable laser of claim 1, wherein said frequency tuning mechanism is configured to allow tuning said laser frequency about a central frequency from a frequency less than the central frequency to a frequency greater the central frequency covering a range of about 30% of said central frequency.

12. The frequency tunable laser of claim 1, wherein said lasing medium comprises a distributed feedback (DFB) grating.

13. The frequency tunable laser of claim 12, wherein the distributed feedback grating is configured to facilitate continuous tuning of a single lasing mode.

14. The frequency tunable laser of claim 13, wherein the distributed feedback grating comprises an asymmetric distributed feedback corrugation structure such that said lasing medium includes a corrugated side and a substantially flat side.

15. The frequency tunable laser of claim 14, wherein the frequency tuning mechanism comprises a tuning element movable relative to said flat side.

16. The frequency tunable laser of claim 15, wherein the tuning element is configured to move along a direction substantially orthogonal to said flat side of the lasing medium so as to vary its distance relative to said lasing medium for tuning said laser frequency.

17. The frequency tunable laser of claim 16, wherein the tuning element comprises a block having a flat side substantially parallel to said flat side of the lasing medium, wherein said laser frequency changes as a function of a distance between said flat side of the tuning block and said flat side of the lasing medium.

18. The frequency tunable laser of claim 3, wherein said radiation field outside the lasing medium propagates along the medium.

19. The frequency tunable laser of claim 5, wherein said tuning element is configured so as to cause an increase in said laser frequency as its distance from said lasing medium decreases.

20. The frequency tunable laser of claim 5, wherein said tuning element is configured so as to cause a decrease in said laser frequency as its distance from said lasing medium decreases.

21. The frequency tunable laser of claim 19, wherein said tuning element is formed of a metal.

22. The frequency tunable laser of claim 20, wherein said tuning element is formed of a dielectric material.

23. The frequency tunable laser of claim 5, wherein said tuning element is in the form of a tuning block having a surface substantially parallel to a surface of said lasing medium.

24. The frequency tunable laser of claim 23, wherein said tuning block is movable relative to said lasing medium along a direction orthogonal to said surface of the lasing medium.

25. The frequency tunable laser of claim 24, wherein said actuator is configured to move said tuning block over a distance in a range of 0.5 to 20 microns relative to said lasing medium.

26. The frequency tunable laser of claim 5, wherein said actuator comprises a piezoelectric element.

27. The frequency tunable laser of claim 5, wherein said actuator comprises a MEMS device.

28. The frequency tunable laser of claim 1, wherein said frequency tuning mechanism is configured to provide continuous tuning of the laser frequency over a selected frequency range.

29. A tunable laser, comprising
a semiconductor lasing medium for generating laser radiation having a mode characterized by a transverse distribution of the laser radiation field such that a fraction of said radiation field extends outside the lasing medium as the laser radiation propagates along the lasing medium, and
a tuning element external to said lasing medium, said element being movable relative to said lasing medium for interacting with the radiation field extending outside the lasing medium so as to change frequency of said laser radiation.

30. The tunable laser of claim 29, wherein said lasing medium has a cross-sectional dimension that is at least 5 times less than a wavelength of said laser radiation.

31. The tunable laser of claim 29, wherein said tuning element is configured to reduce said fraction of the laser radiation field extending outside the laser medium as its distance decreases relative to said lasing medium so as to cause an increase in said laser radiation frequency.

32. The tunable laser of claim 29, wherein said tuning element is configured to enhance said fraction of the laser radiation field extending outside the laser medium as its distance decreases relative to said lasing medium so as to cause a decrease in said laser radiation frequency.

33. The tunable laser of claim 29, further comprising an actuator coupling to said movable tuning element for moving said tuning element relative to said lasing medium.

34. The semiconductor wire laser of claim 29, wherein said transverse distribution of the laser radiation is characterized by a transverse wavevector and a longitudinal distribution of the laser radiation is characterized by a longitudinal wavevector, and wherein said laser frequency and said transverse and longitudinal wavevectors are related by the following relation:
wherein $$k_z^2 + k_{perp}^2 = \omega^2 \mu \in$$

wherein,
$k_z$ denotes the longitudinal wavevector,
$k_{perp}$ denotes the transverse wavevector,
$\mu$ denotes magnetic permeability of the lasing medium,
f denotes dielectric constant of the lasing medium, and $\omega$ denotes angular frequency of the laser radiation, which in turn is defined as:

$$\omega = 2\pi f,$$

wherein,
f denotes the laser frequency.

35. A method for tuning a wire laser, comprising:
adjusting a transverse mode of laser radiation generated by a lasing medium of said laser so as to change frequency of said laser radiation.

36. The method of claim 35, wherein said step of adjusting the transverse mode is performed without causing any substantial change in a longitudinal mode of the laser radiation.

37. The method of claim 35, wherein the step of adjusting the transverse mode comprises changing a transverse distance of an external tuning element relative to said lasing medium.

38. The method of claim 37, wherein said external tuning element is formed of a metal.

39. The method of claim 37, wherein said external tuning element is formed of a semiconductor material.

40. The method of claim 35, wherein said wire laser is configured to generate laser radiation with a frequency in a range of 1 THz to 10 THz.

* * * * *